(12) United States Patent
Schultz et al.

(10) Patent No.: US 7,511,886 B2
(45) Date of Patent: Mar. 31, 2009

(54) OPTICAL BEAM TRANSFORMATION SYSTEM AND ILLUMINATION SYSTEM COMPRISING AN OPTICAL BEAM TRANSFORMATION SYSTEM

(75) Inventors: Joerg Schultz, Aalen (DE); Markus Deguenther, Aalen (DE); Markus Brotsack, Aalen (DE); Gerhard Fuerter, Ellwangen (DE); Wolfgang Singer, Aalen (DE); Manfred Maul, Aalen (DE); Alexander Kohl, Aalen (DE); Damian Fiolka, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 159 days.

(21) Appl. No.: 11/271,976

(22) Filed: Nov. 14, 2005

(65) Prior Publication Data

US 2006/0146384 A1 Jul. 6, 2006

Related U.S. Application Data

(63) Continuation-in-part of application No. PCT/EP03/09613, filed on Aug. 29, 2003, and a continuation-in-part of application No. PCT/EP2004/004004, filed on Apr. 16, 2004, and a continuation-in-part of application No. PCT/EP2004/004874, filed on May 7, 2004.

(30) Foreign Application Priority Data

| May 13, 2003 | (DE) | ............................ 103 21 598 |
| May 13, 2003 | (DE) | ............................ 103 22 375 |
| May 13, 2003 | (DE) | ............................ 103 22 376 |

(51) Int. Cl.
*G02B 5/30* (2006.01)
*G02B 27/28* (2006.01)
*F21V 9/14* (2006.01)
*G03B 27/72* (2006.01)

(52) U.S. Cl. .................. 359/489; 359/497; 359/501; 362/19; 355/71

(58) Field of Classification Search .................. 359/489
See application file for complete search history.

(56) References Cited

U.S. PATENT DOCUMENTS 4,755,027 A * 7/1988 Schafer .................. 359/487

(Continued)

FOREIGN PATENT DOCUMENTS

DE 35 23 641 C1 12/1986

(Continued)

OTHER PUBLICATIONS

David Fink, Rapid Communications, Polarization of Effects of Axicons, Mar. 1, 1979, Applied Optics vol. 18, No. 5, pp. 581-582, Culver City, California.

(Continued)

*Primary Examiner*—Stephone B. Allen
*Assistant Examiner*—Jade Callaway
(74) *Attorney, Agent, or Firm*—Sughrue Mion, PLLC

(57) ABSTRACT

An optical beam transformation system has a sequence of optical elements arranged along an optical axis of the optical beam transformation system and designed for transforming an entrance light distribution striking an entrance surface of the optical beam transformation system into an exit light distribution emerging from an exit surface of the optical beam transformation system by radial redistribution of light intensity. The optical elements include a transformation element causing a radial redistribution of light intensity and having a transformation surface inclined to the optical axis and causing a polarization-selective reflection of a light distribution incident on the transformation surface according to an efficiency symmetry characteristic for the transformation surface. The optical elements further include an optical compensation element effecting a spatially dependent compensation of transmission inhomogeneties caused by the polarization-selective reflection at the transformation surface according to a compensation symmetry adapted to the efficiency symmetry of the transformation surface.

54 Claims, 18 Drawing Sheets

U.S. PATENT DOCUMENTS

| | | | |
|---|---|---|---|
| 5,195,159 A | 3/1993 | Uenishi et al. | |
| 5,343,489 A | 8/1994 | Wangler | |
| 5,357,312 A | 10/1994 | Tounai | |
| 5,675,401 A | 10/1997 | Wangler et al. | |
| 5,726,740 A | 3/1998 | Shiozawa et al. | |
| 6,191,880 B1 | 2/2001 | Schuster | |
| 6,258,443 B1 | 7/2001 | Nilsen et al. | |
| 6,259,512 B1 * | 7/2001 | Mizouchi | 355/67 |
| 6,377,336 B1 | 4/2002 | Shiraishi et al. | |
| 6,452,663 B1 | 9/2002 | Robinson et al. | |
| 6,535,273 B1 | 3/2003 | Maul | |
| 6,597,430 B1 | 7/2003 | Nishi et al. | |
| 6,864,960 B2 * | 3/2005 | Koehler et al. | 355/67 |
| 2001/0019404 A1 | 9/2001 | Schuster et al. | |
| 2001/0046038 A1 | 11/2001 | Mulkens et al. | |
| 2002/0036763 A1 | 3/2002 | Krikke et al. | |
| 2002/0075468 A1 | 6/2002 | Antoni | |
| 2002/0109827 A1 | 8/2002 | Nishi | |
| 2002/0126931 A1 | 9/2002 | Van Der Lei et al. | |
| 2002/0167737 A1 | 11/2002 | Perrin et al. | |
| 2002/0176166 A1 | 11/2002 | Schuster | |
| 2003/0030780 A1 | 2/2003 | Dieckmann et al. | |
| 2004/0012764 A1 | 1/2004 | Mulder et al. | |

FOREIGN PATENT DOCUMENTS

| | | |
|---|---|---|
| DE | 41 24 344 A1 | 1/1993 |
| DE | 44 21 053 A1 | 12/1995 |
| DE | 195 20 563 A1 | 12/1996 |
| DE | 195 35 392 A1 | 3/1997 |
| DE | 198 29 612 A1 | 1/2000 |
| DE | 100 10 131 A1 | 9/2001 |
| DE | 101 24 803 A1 | 11/2002 |
| DE | 101 32 988 A1 | 1/2003 |
| EP | 0 490 291 A1 | 6/1992 |
| EP | 0 564 264 A1 | 10/1993 |
| EP | 0 747 772 | 12/1996 |
| EP | 0 764 858 | 3/1997 |
| EP | 0 949 541 A2 | 10/1999 |
| EP | 1 170 635 A2 | 1/2002 |
| EP | 1 186 956 A2 | 3/2002 |
| EP | 1 217 450 A2 | 6/2002 |
| EP | 1 227 354 A2 | 7/2002 |
| EP | 1 367 446 A1 | 3/2003 |
| WO | WO 00/70660 A | 11/2000 |

OTHER PUBLICATIONS

R.M.A. Azzam, Scheme to Polarization-Correct a Waxicon, Sep. 1, 1982, Applied Optics vol. 21, No. 17, pp. 3067-3068.

John H. McLeod, The Axicon: A New Type of Optical Element, Aug. 1954, Journal of the Optical Society of America vol. 44, No. 8, pp. 592-597.

Efim Khazanov, Use of Parallel Axicon for Compensation of Birefringence in Active Elements of Solid-State Lasers, 2002, SPIE vol. 4632, pp. 155-163.

* cited by examiner

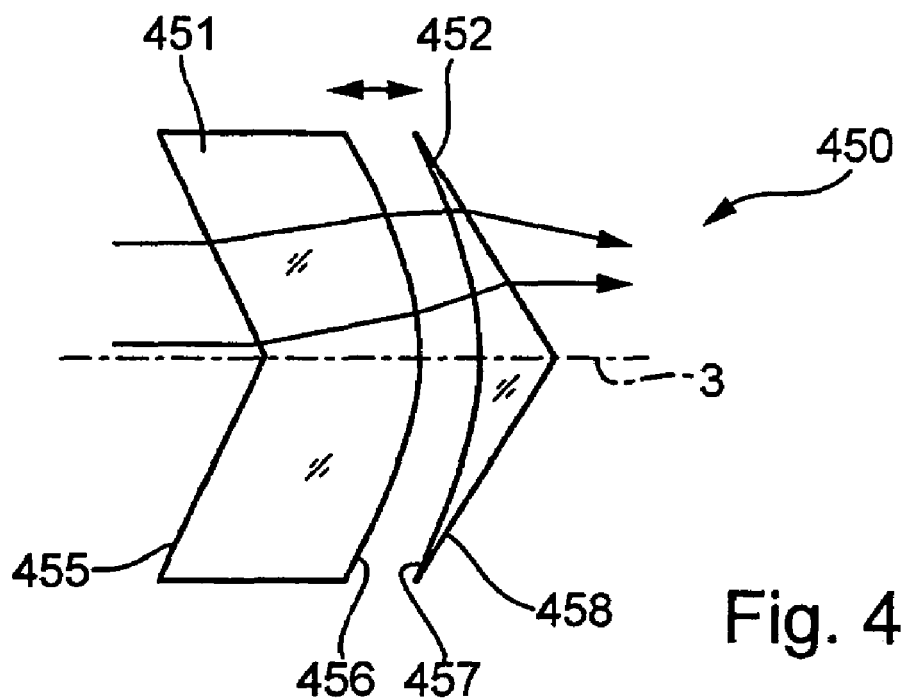
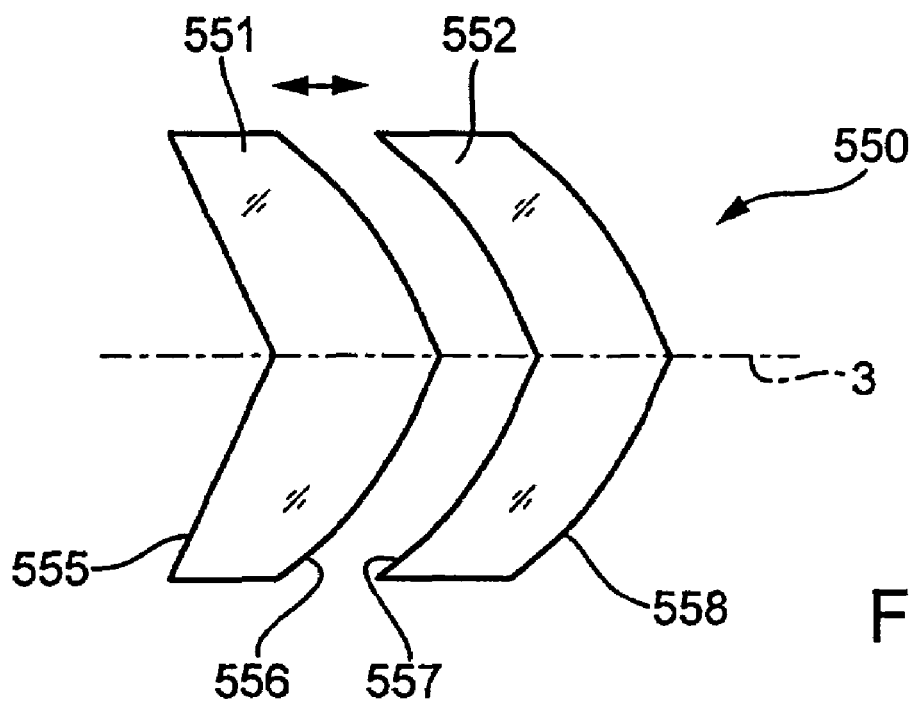

OPTICAL BEAM TRANSFORMATION SYSTEM AND ILLUMINATION SYSTEM COMPRISING AN OPTICAL BEAM TRANSFORMATION SYSTEM

This application is a continuation-in-part application of international patent application PCT/EP2003/009613 filed on Aug. 29, 2003, and claiming priority from German patent application DE 103 22 375.4 filed on May 13, 2003; this application is also a continuation-in-part application of international patent application PCT/EP2004/004004 filed on Apr. 16, 2004, and claiming priority from German patent application DE 103 21 598.0 filed on May 13, 2003; and this application is also a continuation-in-part application of international patent application PCT/EP2004/004874 filed on May 7, 2004, and claiming priority from German patent application DE 103 22 376.2 filed on May 13, 2003. Priority is claimed from German patent application DE 103 22 375.4 filed on May 13, 2003, German patent application DE 103 21 598.0 filed on May 13, 2003 and German patent application DE 103 22 376.2 filed on May 13, 2003. The complete disclosures of the international and German patent applications are incorporated into this application by reference.

BACKGROUND OF THE INVENTION

1. Field of the Invention

The invention relates to an optical beam transformation system for transforming an entrance light distribution striking an entrance surface of the optical beam transformation system into an exit light distribution emerging from an exit surface of the optical beam transformation system by radial redistribution of light intensity, as well as to an illuminating system for an optical device which includes at least one such optical beam transformation system. The optical device including the illuminating system may be a projection exposure apparatus for microlithography.

2. Description of the Related Art

The efficiency of projection exposure apparatuses for the microlithographic production of semiconductor components and other finely structured subassemblies is determined substantially by the imaging properties of the optical projection system. Moreover, the image quality and the wafer throughput achievable with an apparatus are substantially codetermined by properties of the illuminating system connected upstream of the projection objective. The said system must be capable of preparing the light of a light source with the highest possible efficiency and in the process setting a light distribution which can be precisely defined with reference to the position and shape of illuminated regions, and in the case of which as uniform as possible a distribution of intensity is present within illuminated regions. These requirements are to be fulfilled in equal measure for all settable illuminating modes, for example for conventional settings with various degrees of coherence or in the case of an annular field, dipole or quadrupole illumination.

A requirement becoming ever more important which is placed on illuminating systems consists in that the latter are to be capable of providing output light with a state of polarization which can be defined as precisely as possible. For example, it may be desired for the light falling onto the photomask or into the downstream projection objective to be largely or completely linearly polarized and to have a defined alignment of the preferred direction of polarization. Modern catadioptric projection objectives with a polarization beam splitter (beam splitter cube, BSC) having a theoretical efficiency of 100% at the beam splitter, for example, can operate with linearly polarized input light.

If the illuminating system is used in conjunction with an excimer laser light source, which already provides largely linearly polarized light, linearly polarized output light can be provided by virtue of the fact that the overall illuminating system operates substantially in a fashion maintaining polarization. An optical system operates "in a fashion maintaining polarization" in the meaning of this application when the state of polarization of the light emerging from the optical system corresponds substantially to the state of polarization of the light entering the optical system.

Illuminating systems, in particular those used for microlithography projection exposure apparatuses, normally have a complex design with a multiplicity of different subsystems and components for various functionalities. If it is desired in the case of one illuminating system to be able to switch over between conventional (axial, on-axis) illumination and nonconventional (abaxial, off-axis) illumination, use is preferably made for this purpose of optical beam transformation system, such as axicon systems, which are capable of transforming by radial redistribution of light intensity an entrance light distribution striking an entrance surface of the optical beam transformation system into an exit light distribution in the case of which the light intensity outside the optical axis is substantially greater than in the region of the optical axis. These nonconventional illumination settings for producing an abaxial, oblique illumination can serve the purpose, inter alia, of increasing the depth of field by means of two-beam interference, and of increasing the resolving power of projection exposure apparatuses.

EP 747 772 describes an illuminating system having a combined zoom-axicon objective in the object plane of which a first diffractive raster element with a two-dimensional raster structure is arranged. This raster element serves the purpose of increasing the geometrical flux of the striking laser radiation by introducing aperture, and of varying the form of the light distribution such that, for example, an approximated circular distribution (for conventional illumination) or a polar distribution results. In order to alternate between these illumination modes, first raster elements are exchanged as appropriate. The zoom-axicon objective combines a zoom function for infinite adjustment of the diameter of a light distribution with an axicon function for radial redistribution of light intensities. The axicon system has two axicon elements which can be displaced axially relative to one another and have mutually facing conical axicon surfaces which can be moved towards one another until their spacing is zero. Consequently, the annularity of the illumination and the degree of coherence can be adjusted by adjusting the zoom axicon. A second raster element, which is located in the exit pupil of the objective, is illuminated with the corresponding (axial or abaxial) light distribution, and forms a rectangular light distribution whose shape corresponds to the entrance surface of a downstream rod integrator.

Other illuminating systems with axicon systems for radial redistribution of optical energy are shown, for example, in U.S. Pat. No. 5,675,401 belonging to the applicant, in U.S. Pat. No. 6,377,336 B1, nd in parallel property rights or in U.S. Pat. No. 6,452,663 B1.

The invention also relates to an illuminating system for a microlithography projection exposure apparatus, comprising an axicon module. The axicon module acts as an optical beam transformation system.

Such illuminating systems are disclosed, for example, in DE 44 21 053 (U.S. Pat. No. 5,675,401) or DE 195 20 563 (U.S. Pat. No. 6,258,443). In particular, the references cited in DE 44 21 053 (U.S. Pat. No. 5,675,401) specify known axicon modules in illuminating systems.

An axicon module may have first axicon element with a first axicon surface, and a second axicon element, assigned to the first axicon element, with a second axicon surface. When the two axicon surfaces are arranged along an optical axis at a spacing, the axicon module produces an illumination distribution with a central intensity minimum. The axicon module is arranged as a rule in the illuminating system such that the exit pupil of the illuminating system has the illumination with the central intensity minimum. An annular illumination results in the case of conical axicon surfaces. The diameter of the annular illumination can be changed by varying the spacing of the two axicon elements. A multipole illumination is produced if the axicon surfaces are respectively formed from individual segments that are arranged pyramidally, that is to say form the roof of a multihedral pyramid, as it were. The quadrupole illumination frequently used in lithography results in the case of four segments. In the case of multipole illumination, as well, it is possible to vary the spacing of the illuminated regions from the optical axis by varying the spacing of the two pyramidal axicon elements. The lithographic transfer of a mask pattern onto the substrate to be exposed can be optimized by varying the illumination distribution in the exit pupil of an illuminating system for microlithography projection exposure apparatuses. The two axicon surfaces of the mutually assigned axicon elements are generally concave-convex or convex-concave.

Pairs of axicon elements arranged one behind another and with conical and pyramidal axicon surfaces are also known from EP 0 949 541. The spacing of the axicon elements is variable in each case here.

DE 195 35 392 (U.S. Pat. No. 6,191,880) discloses an illuminating system for a microlithography projection exposure apparatus having an axicon module. Furthermore, the illuminating system has a polarization-influencing optical element in order to polarize rays radially in relation to the optical axis of the illuminating system. However, in the exemplary embodiment illustrated in FIG. 5, the polarization-influencing optical element is arranged at the earliest downstream of the axicon module. Consequently, the rays with the polarization state prescribed by the light source strike the axicon surfaces. The lasers used in microlithography at DUV wavelengths generally produce linearly polarized light. In accordance with DE 195 35 392 the polarization-influencing optical element is preferably arranged at the earliest downstream of the last asymmetric element such as, for example, deflecting mirror or polarization beam splitter layers. Otherwise, the radial polarization that is desired for the optimum incoupling of the rays into the wafer resist is lost again.

A similar illuminating system to that from DE 195 35 392 (U.S. Pat. No. 6,191,880) is disclosed in DE 100 10 131 (US 2001/0019404). In this case, too, the polarization-influencing optical element is arranged at the earliest downstream of the axicon module. Consequently, in the illuminating system of DE 100 10 131 as well the rays with the polarization state prescribed by the light source strike the axicon surfaces. The polarization-influencing optical element produces tangential polarization in DE 100 10 131. The tangential polarization of the rays improves the two-beam interference during the production of images. In accordance with the disclosure in DE 100 10 131, it is necessary for the polarization-influencing optical element to be arranged at the earliest downstream of the last asymmetric element such as, for example, deflecting mirror or polarization beam splitter layers. Otherwise, the tangential polarization is lost again.

The light sources used in microlithography projection exposure apparatuses generally produce linearly polarized or unpolarized light. The latter then strikes the axicon surfaces of the axicon module. The axicon surfaces have optical surfaces that are inclined with reference to the optical axis. This results at the axicon surfaces in reflection losses that depend on the polarization state of the rays, as will be explained below. The polarization component whose electric vector vibrates parallel to the incidence plane of a ray is denoted below as p-component. Correspondingly, the polarization component with electric E-field vector vibrating perpendicular to the incidence plane of a ray is denoted below as s-component. Consideration is given to an axicon module that is arranged along an optical axis running in the z-direction. The axicon surfaces each comprise four segments of a pyramidal structure that are inclined at the Brewster angle. The pyramidal structure is aligned in the x/y-direction. The axicon surfaces are intended to have no antireflection coating. The incident rays may be linearly polarized in the y-direction. The rays are now reflected at the axicon surfaces as a function of polarization in accordance with the Fresnel formulas, or refracted. The p-polarized rays are refracted at the segments, arranged in the positive and negative y-directions, of the axicon surfaces without reflection losses, while the s-polarized rays suffer reflection losses at the segments, arranged in the positive and negative x-directions, of the axicon surfaces. As a result of this, downstream of the axicon module the rays impinging along the y-axis have a higher intensity than the rays impinging along the x-axis. The intensity distribution is therefore nonuniform downstream of the axicon module and greater in the quadrants arranged along the y-axes than in the quadrants arranged along the x-axis. Consequently, the individual illuminated regions have total intensities of different magnitude. However, because of the polarization-dependent refraction/reflection a nonuniform intensity distribution results even with a suitable antireflection coating or with an adaptation of the inclination angle of the axicon surfaces. Consequently, structures are imaged differently as a function of their orientation during the lithography process. In addition, with conical axicon surfaces there is also a change in the polarization state for rays that do not strike the axicon surfaces along the x-axis and the y-axis. The change in the linear polarization state of a ray can lead to further losses at downstream deflecting mirrors or polarization-dependent beam splitter layers.

Conventional beam transformation systems, such as axicon systems, generally do not operate to maintain polarization. Because of the rotationally symmetrical or radially symmetrical geometry of the axicon surfaces with refracting surfaces inclined obliquely to the optical axis, in the case of linearly polarized input radiation, for example, beams with an identical direction of oscillation of the electric field vector are not incident everywhere in identically oriented incident planes with reference to the refracting axicon surfaces. Consequently, because of Fresnel losses, the entering light experiences an attenuation, dependent on the location of incidence and therefore differing locally, of the p- or s-components of the electric field strength. Here, the s-component is that electric field strength component which runs perpendicular to the plane of incidence which is defined by the surface normal to the axicon surface at the striking location and by the beam entrance direction. The p-component is the electric field strength component which oscillates parallel to the plane of incidence, that is to say in the plane of incidence itself. Consequently, incidences of attenuation can occur which vary on axicon surfaces in the azimuthal direction (circumferential direction). This leads in the case of homogeneous polarized entrance light to a polarization of the light distribution downstream of the axicon system which is no longer homogeneous. In the case of conventional axicon systems and linearly polarized input light, the loss in the linear degree of polarization can certainly be of the order of magnitude of up to approximately 10%.

It is known that axicon systems can have a polarizing effect. DE 35 23 641 (corresponding to U.S. Pat. No. 4,755, 027) describes a polarizer that uses the polarization-selective effect of a number of consecutive axicon surfaces in order to produce tangential or radial polarization. The polarization-selective effect produced by the axicon surfaces inclined obliquely to the optical axis is amplified in the case of some embodiments by suitable optical coatings. Another polarizer with conical surfaces is shown in DE 195 35 392 A1 (corresponding to U.S. Pat. No. 6,191,880 B1).

SUMMARY OF THE INVENTION

It is one object of the invention to provide an optical beam transformation system which, by comparison with conventional optical beam transformation systems, exhibits a substantial reduction in polarization-varying effect.

It is another object of the invention to provide an optical beam transformation system which operates in a substantially polarization-maintaining fashion.

It is yet another object of the invention to provide an optical beam transformation system exhibiting a significant reduction in transmission inhomogenities caused by polarization effects when compared to conventional optical beam transformation systems.

It is yet another object of the invention to provide an optical system including an optical beam transformation system, where the optical system has a largely uniform transmission function.

It is yet another object of the invention to provide an optical beam transformation system where rays pass through that optical beam transformation system with minimum intensity losses.

To address these and other objects the invention, according to one formulation of the invention, provides an optical beam transformation system comprising:

a sequence of optical elements arranged along an optical axis of the optical beam transformation system and designed for transforming an entrance light distribution striking an entrance surface of the optical beam transformation system into an exit light distribution emerging from an exit surface of the optical beam transformation system by radial redistribution of light intensity;

the optical elements including at least one transformation element causing a radial redistribution of light intensity and having at least one transformation surface inclined to the optical axis and causing a polarization-selective reflection of a light distribution incident on the transformation surface according to an efficiency symmetry characteristic for the transformation surface;

the optical elements further including at least one optical compensation element effecting a spatially dependent compensation of transmission inhomogeneties caused by the polarization-selective reflection of the transformation surface according to a compensation symmetry adapted to the efficiency symmetry of the transformation surface.

The compensation of undesirable side-effects caused by one or more transformation elements designed for effecting a desired radial redistribution of light intensity may be brought about in various ways which may be utilized independent of each other, or in combination.

For example, the optical beam transformation system may include a first transformation element with a first transformation surface inclined to the optical axis, and at least one second transformation element with a second transformation surface inclined to the optical axis, where at least one intermediate surface is arranged between the first transformation surface and the second transformation surface. This arrangement permits a distribution of the overall functionality of the optical beam transformation system over more than two optical surfaces, such that a potential polarization-varying effect of the first and second transformation surfaces can be reduced or at least partially compensated. For example, all the transformation and intermediate surfaces can have a deflecting action, and thus make an effective contribution to the radial redistribution of light energy. By doing so, it is possible to fashion the transformation surfaces such that incidence angles (angles of incidence) in the vicinity of the respective Brewster angles associated with the transformation surfaces do not occur on any of the transformation surfaces. For example, the incidence angles may be at least 10° or at least 15° or at least 20° or more degrees away from the associated Brewster angle. It is thereby possible to substantially reduce the intensity splitting between s-polarized and p-polarized components of the radiation at the transformation surfaces such that the polarization selectivity of the entire optical beam transformation system may be kept below a critical value.

Compensation may also be effected by influencing the radiation incident on the critical transformation surfaces such that all the rays of a beam incident on a transformation surface are refracted at the transformation surfaces approximately without a change in the polarization state. For example, a polarization-influencing optical element may be provided as a optical compensation element, where this optical compensation element is arranged in the light direction upstream of the transformation surface and is designed in such a way that rays striking the transformation surfaces are polarized approximately perpendicular or approximately parallel to the respective incidence plane of rays on the transformation surface. For this purpose, the optical compensation element may have a compensation efficiency adapted to the efficiency symmetry of the transformation optical element such that the optical beam transformation system operates in a substantially polarization-maintaining fashion, whereby each ray downstream of the optical beam transformation system has approximately the same polarization state as the same ray had upstream of the optical beam transformation system.

According to another aspect of the invention the compensation element has an anisotropic transmission according to a non-uniform spatial distribution of transmittance adapted to substantially reduce spatial transmission non-uniformities effected by the transformation element. According to this aspect of the invention, the compensation is effective on the intensity level of the radiation passing through the optical beam transformation system in order to obtain a desired spatial distribution of light intensity across the beam diameter.

The optical compensation element may have a n-fold radial compensation symmetry adapted to an n-fold efficiency symmetry of the transformation optical element, where n is an integer number with $n \geq 2$. In cases where n=2, for example, the compensation element may have a substantially elliptic efficiency characteristic with respect to the optical axes. Such compensation elements may be useful to compensate polarization dependent effects caused by conical transformation surfaces, for example.

In some embodiments, at least one transformation element is an axicon element and the transformation surface is an axicon surface. The axicon surface may be a conical surface. Cone-shaped axicon surfaces are preferably used when annular illumination is desired. It is also possible that an axicon surface is formed as a multifaceted pyramid having at least two, preferably planar, pyramid facets inclined to the optical axis. A multipole illumination, such a dipole illumination or quadrupole illumination, may be produced if a axicon surfaces having the form of a multifaceted pyramid are used. An optical beam transformation system can simultaneously have axicon elements with conical and pyramidal axicon surfaces that are connected in series. In some cases it may be useful if at least one axicon surface is a quasi-conical optical surface curved about a plurality of axes and having a first curvature, running in the circumferential direction, and a second curvature which lies in a plane of curvature containing the optical axis. Optical elements having such surfaces are also designated here as "acon lenses" or "lens acon".

The optical beam transforming system may include an axicon system or may essentially be formed by an axicon system. In these cases, at least one transformation element shaped as an axicon element is utilized in the optical beam transforming system.

An axicon system serves the purpose of transforming an entrance light distribution striking an entrance surface of the axicon system into an exit light distribution emerging from an exit surface of the axicon system by radial redistribution of the light intensity. The axicon system may comprise:

an optical axis; a first axicon element with a first axicon surface; at least one second axicon element with a second axicon surface; and at least one intermediate surface arranged between the first axicon surface and the second axicon surface.

This arrangement permits a distribution of the overall functionality of the axicon system over more than two optical surfaces, such that the polarization-varying effect of the first and second axicon surfaces can be reduced or at least partially compensated. For example, all the surfaces can have a deflecting action, and thus make an effective contribution to the radial redistribution.

In accordance with a development, the intermediate surface is likewise an axicon surface which can be provided on the first and/or on the second axicon element or on an additional, further axicon element. By suitable design of the geometry of the axicon surfaces, it is possible via the refracting action of the intermediate surface to reduce the deflecting action, required for a desired redistribution, of the first and second axicon surfaces to such an extent that their polarization-varying or polarization-selective action is reduced. When the intermediate surface is largely or completely planar, an arrangement downstream of an axicon surface is advantageous, since the intermediate surface is then in the oblique beam path and acts in a fashion that is refracting or deflecting or varies the beam angle.

The axicon surfaces can be fashioned such that incident angles which are in the vicinity of the respectively associated Brewster angle do not occur on any of the axicon surfaces. For all axicon surfaces, the incident angles, occurring on the axicon surfaces, of the penetrating radiation are preferably at an angular spacing of at least 10°, in particular at least 15° or at least 20° or more, from the associated Brewster angle. It is thereby possible to achieve a situation where only a slight and, if appropriate, negligible splitting occurs on such surfaces between s-polarized and p-polarized components of the radiation.

For example, it is possible at all locations of the axicon surfaces for the local inclination angles to be minimized with reference to a radial plane perpendicular to the optical axis such that they are smaller than approximately 30° and, in particular, lie between approximately 20° to 25°. In this case, inclination angles much below 30°, 25° or 20° are preferred. A minimization of incident angles on the axicon surfaces can be facilitated, if appropriate, by providing more than one intermediate surface, for example two, three, or four intermediate surfaces, which can all be fashioned as axicon surfaces, if appropriate.

The axicon surfaces and the at least one intermediate surface are expediently each covered by an antireflection coating in order to minimize transmission losses. The antireflection layer can be designed in this case such that polarization effects are minimized.

In one development, at least one of the axicon surfaces is conical or cone-shaped, all of the axicon surfaces preferably being conical. It is possible as a result, for example, for a circular entrance light distribution to be transformed into a circular, annular exit light distribution, in order to provide annular illumination.

It is also possible for at least one of the axicon surfaces to have the form of a multifaceted pyramid having at least two normally planar pyramid facets inclined to the optical axis. The pyramid facets can be arranged with radial symmetry about the optical axis such that an n-fold radial symmetry is produced, n being the number of the pyramid facets. It is, for example, possible for there to be present two, three, four, five, six, seven, eight, nine, ten, eleven, twelve or more pyramid facets which can have the same shape and size. The larger the number of the pyramid facets, the better it is possible to approximate an annular shape for the exit light distribution. In general, polygonal axicon surfaces with a pyramid shape can produce exit light distributions which are composed of a plurality of largely straight illumination strips at an angle to one another which either merge directly into one another in the circumferential direction, or are at a spacing from one another.

It is also possible for at least one axicon surface to be a quasi-conical optical surface curved about a plurality of axes and having a first curvature, running in the circumferential direction, and a second curvature which lies in a plane of curvature containing the optical axis. Optical elements having such surfaces are also designated here as "acon lenses" or "lensacon".

In some embodiments, the axicon system is designed such that light rays of the penetrating light, at each axial position between the entrance surface and the exit surface of the axicon system, run at an angle to the optical axis which is substantially outside the paraxial angular range. There is thus no region with a parallel ray path between the entrance surface and exit surface. In this way, the radial redistribution can be achieved with the aid of a design which is compact in the axial direction.

Although it is possible for the axicon system to be designed only for a specific redistribution geometry, it is preferred when an axial spacing between the first axicon element and the second axicon element is adjustable. The extent of the achievable radial displacement of light intensity can thereby be adjusted, preferably infinitely, in order, for example, to facilitate abaxial (off-axis) illumination of a surface to be illuminated with the aid of incident angles of the illuminating light which can be specifically set.

In some embodiments, all the axicon elements and, if appropriate, also an intermediate element forming the intermediate surface are formed in each case by unipartite optical components which can consist of a transparent material. There are also embodiments in the case of which at least one axicon element is assembled from a plurality of separate individual elements arranged about the optical axis of the axicon system and in each case having at least one boundary surface serving as pyramid facet. The normally wedge-shaped individual elements can be fixed on one another or be immovable relative to one another. In some embodiments, the individual elements are, however, mounted movably in such a way that they can be tilted about an axis perpendicular to a radial direction of the optical axis. It is thereby possible for the inclination angles of the optically active partial surfaces of the axicon surface (pyramid facets) to be adjusted by tilting the elements. If the tilting axis is situated close beside or on the optical axis, it is possible in this way to form an optical system with an "umbrella mechanism" by way of example, which can operate in the manner of a Brewster telescope. Arrangements are also possible in which the tilting axes are arranged at a greater spacing from the optical axis.

In another variant of the invention, a polarization rotator for rotating the polarization of the penetrating light by approximately 90° is arranged between the first and the second axicon element. In this case, the at least one intermediate surface can be formed on the polarization rotator. The polarization rotator can comprise an optical delay (retardation) of half a wavelength between two mutually perpendicular states of polarization (s- and p-component).

As a result of a polarization rotator of this type, it is possible for the field strength component which is stronger upstream of the polarization rotator to be weaker downstream of the polarization rotator, and vice versa. The polarization-splitting action of the first axicon surface in the light path can be compensated largely or completely, since a stronger polarization component arriving at the second axicon surface following the polarization rotator is attenuated more strongly in the correct position than the associated weaker polarization component. Consequently, the p-component and the s-component of the entrance light distribution are influenced overall with approximately the same intensity by the axicon system, and so essentially no change occurs in the state of polarization upon passage through the axicon system. The degree of polarization present upstream of the entrance surface can thus be largely or completely transmitted by the axicon system.

The optical delay (retardation) system can be formed, for example, by a single, unipartite or assembled optical element which has the action of a $\lambda/2$ plate. It is favourable when the entrance and exit surface of the delay system has the same rotationally symmetrical or pyramidal or polygonal symmetry as the neighbouring axicon surfaces. In the case of a conical first and second axicon surface, the delay element can be designed, for example, as a doubly conical element, ideally with the same conical angle. The delay element can also be assembled from a plurality of segments, for example from triangular plates resembling pieces of cake and made from a suitable birefringent material. Coming into consideration as birefringent materials are, for example, magnesium fluoride, crystalline quartz or a fluoride crystalline material such as calcium fluoride, which can have intrinsic birefringence of sufficient intensity given suitable orientation relative to the transirradiation direction (<110> axis substantially parallel to the transirradiation direction). It is also possible on the basis of the low angular loading of the birefringent material between the axicon surfaces to use multiorder delay elements which can be produced with relatively large thicknesses, for example more than 1 mm, and are thus mechanically relatively stable and can be mounted with an acceptable structural outlay.

It can be provided in all embodiments that at least one axicon element, if appropriate the entire axicon system, is mounted rotatably about the optical axis. It is possible in this way, if appropriate, to achieve an optimal orientation of the axicon system with reference to a preferred direction of polarization of the incoming radiation.

The invention also relates to an illuminating system for an optical device, in particular for a projection exposure apparatus for microlithography, which includes at least one optical beam transformation system in accordance with the invention. The illuminating system can furthermore include at least one light mixer, which can be arranged upstream or downstream of the optical beam transformation system. It is favourable when the light mixer is one which largely maintains polarization. The light mixer can include, for example, one or more honeycomb condensers (fly's eye lenses), diffusers or one or more integrator rods or a combination of such light mixing elements. Embodiments of polarization-maintaining and angle-maintaining light mixers with rod integrator are to be gathered from the still unpublished Patent Application DE 102 06 061.4 belonging to the applicant, such that the disclosure content thereof is to this extent incorporated in the content of the description.

The use of optical beam transformation systems according to the invention is not, however, limited to illuminating systems for microlithography. Optical beam transformation systems according to the invention can also be used in the illuminating system of microscopes or generally as beam widening devices, which can be set variably if appropriate, for other applications. Depending on the direction of transirradiation, a radial redistribution in the direction of the optical axis is also possible.

An alternative form of a polarization-maintaining axicon system has two axicon elements which can be displaced axially relative to one another and have mutually facing conical or polygonal axicon surfaces which can be moved towards one another until their spacing is zero, and which are the sole axicon surfaces of the axicon pair. In order to reduce or avoid the problems of polarization explained at the beginning, the inclination angles of the axicon surfaces are substantially smaller than customary to date. For example, they can be less than 30° or 25° or under, such that the incident angles occurring have a large spacing of, for example, more than 10° or 15° or 20° from the Brewster angle. In order to permit a sufficiently large radial redistribution of light, the settable maximum spacing of the axicon elements must be enlarged, if appropriate.

The invention also relates to an illuminating system for a microlithography projection exposure apparatus, comprising an axicon module (or axicon system).

An axicon module may have first axicon element with a first axicon surface, and a second axicon element, assigned to the first axicon element, with a second axicon surface. When the two axicon surfaces are arranged along an optical axis at a spacing, the axicon module produces an illumination distribution with a central intensity minimum. The axicon module is arranged as a rule in the illuminating system such that the exit pupil of the illuminating system has the illumination with the central intensity minimum.

In order to keep the reflection losses at the axicon surfaces as low as possible and largely to minimize polarization effects, a polarization-influencing optical element may be arranged in the light direction upstream of the axicon module. The polarization-influencing optical element is designed here in such a way that the rays are polarized approximately perpendicular or parallel to the incidence plane of the rays with reference to the axicon surfaces. The incidence plane of a ray is defined here by the ray and the surface normal to the point of impingement of the ray on the axicon surface. As a result of this adaptation of the polarization state, all the rays are refracted at the axicon surfaces approximately without a change in the polarization state. If reflection losses occur, these are of the same magnitude for all the rays.

The polarization-influencing optical element according to this formulation of the invention acts as an optical compensation element effecting a spatially dependent compensation of transmission inhomogeneties caused by the polarization-selective reflection of the transformation surface (axicon surface) according to a compensation symmetry adapted to the efficiency symmetry of the transformation surface.

Various polarization-influencing optical elements for suitably adapting the polarization state of a ray are disclosed in DE 195 35 392 (U.S. Pat. No. 6,191,880) or DE 101 24 803 (US 2002/176166), the disclosure content of which with reference to the design of polarization-influencing optical elements is also incorporated in full in the present application.

The raster arrangement with half-wave plates ($\lambda/2$ plate) disclosed in DE 195 35 392, the reflection polarizer with a frustoconical polarizing surface, or a combination of a birefringence quarter-wave plate under radial compressive stress and a circularly birefringent plate rotating by 45° can be used as first polarization-influencing optical element for the purpose of producing a radial polarization distribution.

Further embodiments of the first polarization-influencing optical element can be gathered from DE 101 24 803 (US 2002/176166). The first polarization-influencing optical element consists here, for example, of a plane-parallel plate made of anisotropic, optically uniaxial crystal whose crystalographic axis is substantially perpendicular to the plane-parallel plate surfaces. Mutually assigned, deflecting structures with mutually coordinated deflecting properties are formed on the entrance side and the exit side of the plate. The angles under which the incident rays run through the birefringent crystal are prescribed by the orientation and the design of the deflecting structures. In this case, the mutually perpendicular polarization components of a ray suffer an optical path difference. It is thereby possible for the polarization state of the rays striking the individual structures to be purposely influenced. Any desired polarization distributions can be produced by the parallel arrangement of a multiplicity of structures. Alternatively, the polarization-influencing optical element can comprise a raster arrangement of birefringent elements made of anisotropic crystal. The crystalographic axes of the individual elements are arranged in askew fashion in relation to the optical axis in this case. The polarization state of the rays inside the individual elements can be purposely influenced individually by the orientation of the cystalographic axes.

It is also possible to arrange further optical elements between the first polarization-influencing optical element and the first axicon element if these elements are largely without influence on the polarization state of the rays.

It is favorable in the case of conical axicon surfaces for producing an annular illumination distribution if the rays are radially or tangentially polarized when they strike the axicon surfaces. The rays are thereby always polarized parallel or perpendicular to the incidence plane of the rays. By comparison with the tangential polarization, the radial polarization has the advantage that the rays are refracted by virtually 100% even without an antireflection coating of the axicon surfaces when the rays strike the axicon surfaces at the Brewster angle. A suitable antireflection coating is advantageous in the case of tangential polarization.

In order to produce a multipole illumination, the axicon surfaces comprise a number of generally flat segments that are arranged pyramidally. The number of the segments corresponds in this case to the number of the poles, for example of the illuminated regions. Because of the pyramidal shape, the segments are respectively inclined about tilt axes perpendicular to the optical axis. Here, the direction of the maximum surface gradient of each segment generally runs through the pyramidal point and the middle of the respective segment. Were contour lines to be drawn on the pyramidal axicon surface, the direction of the maximum surface gradient would run perpendicular to the contour lines. It is favorable when the rays are linearly polarized parallel or perpendicular to a plane that is perpendicular to the respective segment surface and that contains the direction of the maximum surface gradient. If the rays are linearly polarized parallel to this plane, a virtually 100% transfer results even given a defective antireflection coating of the axicon surfaces when the rays strike the individual segments at the Brewster angle. If the rays are linearly polarized parallel to this plane, the axicon surfaces should additionally be coated with a suitable antireflection coating.

An axicon module can simultaneously have axicon elements with conical and pyramidal axicon surfaces that are connected in series. It is favorable for the purpose of varying the illumination distribution downstream of the axicon module when the spacing of the axicon elements along the optical axis can be varied by displacing or exchanging the axicon elements.

Raster arrangements of half-wave plates whose principal axes are suitably oriented are particularly favorable as polarization-influencing optical elements, since they vary the polarization state in a virtually lossless fashion and can be arranged to save space. If the rays impinging on the raster arrangement are linearly polarized, the principal axes should be oriented in the direction of the angul bisector between the polarization direction of the incident rays and the desired polarization direction of the emerging rays. It is favorable in the case of conical axicon surfaces when the number of the raster elements is large, for example 10 to $10^2$. Radial or tangential polarization can thereby be set with adequate accuracy. The raster elements can in this case be hexagonal or have a fan-like sector subdivision. With pyramidal axicon surfaces, the number of the raster elements can correspond to the number of the segments. Thus, a raster arrangement with four half-wave plates suffices in the case of an axicon surface with four segments for producing a quadrupole illumination. The reason for this is that with pyramidal axicon surfaces the incidence planes for a segment run parallel, and thus the same polarization influence is required for all the rays that strike a segment. Thus, precisely in the case of pyramidal axicon surfaces, rays that are linearly polarized parallel to one direction can be transformed with a few half-wave plates into rays that then strike the downstream segments with the polarization state according to the invention.

The raster arrangement of half-wave plates has the further advantage that they can be joined in an optically seamless fashion, in particular wrung, to the axicon element. Glossy interfaces are thereby eliminated. Since half-wave plates are very thin when, for example, they are made of magnesium fluoride and are to be operated in the zeroth order, they can be stabilized by being wrung. However, calcium fluoride oriented in the <110> crystal direction can also be used as material for the half-wave plates.

The raster arrangement of half-wave plates operates particularly effectively when the rays upstream of the raster arrangement are linearly polarized parallel to a direction that is perpendicular to the optical axis of the illuminating system. The suitably oriented half-wave plates need then only rotate the polarization state into the desired direction. This is performed here virtually without loss of intensity. The laser light sources frequently used in microlithography projection exposure apparatuses already produce largely linearly polarized light. Unpolarized light can be linearly polarized in a suitable way with the aid of polarization filters. A suitably oriented quarter-wave plate ($\lambda/4$ plate) should be arranged upstream of the raster arrangement of half-wave plates in the case of circularly polarized rays.

It is advantageous for specific applications when following downstream of the axicon module is a further polarization-influencing optical element that produces a prescribed polarization distribution. This polarization distribution is matched here to the polarization optical properties of the downstream optical elements. Thus, for example, given downstream plane deflecting mirrors or deflecting prisms, it is advantageous when the rays are respectively linearly polarized in relation to a direction perpendicular to an optical axis. It is optimum to change the polarization state of the rays parallel to the respective incidence plane. The rays should likewise be linearly polarized parallel to a preferred direction in the case of downstream polarization optical beam splitter layers. It is advantageous for the purpose of optimizing the two-beam interference when the rays are polarized tangential to the optical axis. However, it is also advantageous with microlithography projection exposure apparatuses when the rays strike the structure to be imaged in a circularly polarized fashion. The second polarization-influencing optical element can be used to ensure that the rays in each case have a polarization state that is optimum for the efficiency and the optical properties of the system.

Elements such as are disclosed in DE 195 35 392 (U.S. Pat. No. 6,191,880) or DE 101 24 803 (US 2002/176166) can also be used for the second polarization-influencing optical element. Particularly advantageous is a raster arrangement of half-wave plates whose principal axes are suitably oriented. If the aim is to use the second polarization-influencing optical element to produce a circular polarization distribution, this is can be achieved by arranging a quarter-wave plate downstream of the raster arrangement with half-wave plates.

This raster arrangement can then advantageously be joined in an optically seamless fashion, in particular wrung, to the second axicon element.

To the extent that they are largely without influence on the polarization state of the rays, further optical elements can also be arranged between the second axicon element and the second polarization-influencing optical element.

The two polarization-influencing elements can also be arranged and configured such that each ray downstream of the second polarization-influencing element has approximately the same polarization state as the same ray had upstream of the first polarization-influencing element. The result of this, in conjunction with a high transmission efficiency, is that the polarization state of the rays is not influenced by the axicon module. Polarization-maintaining illuminating systems are thereby rendered possible even when axicon modules are being used.

Such illuminating systems can be used advantageously in microlithography projection exposure apparatuses that, starting from the light source, comprise an illuminating system according to the invention, a mask-positioning system, a pattern-bearing mask, a projection objective, an object-positioning system and a photo-sensitive substrate.

Microstructured semiconductor components can be produced with the aid of this microlithography projection exposure apparatus.

An axicon system according to another formulation of the invention serves the purpose of transforming an entrance light distribution striking an entrance surface of the axicon system into an exit light distribution emerging from an exit surface of the axicon system by radial redistribution of the light intensity. It comprises: an optical axis; at least one axicon element with at least one axicon surface; and compensation means for spatially dependent compensation of transmission inhomogeneities of the axicon system caused by polarization-selective reflection at the axicon surface, the compensation means that act on the radiation passing through having with reference to the optical axis an essentially two-fold radially symmetrical efficiency characteristic in the case of which a first efficiency in the region around a first direction running perpendicular to the optical axis is significantly higher or lower than a second efficiency in the region of a second direction running perpendicular to the first direction and to the optical axis.

Because of the rotationally symmetrical or radially symmetrical geometry of the axicon surfaces with refractive surfaces inclined obliquely to the optical axis, beams of the same vibration direction of the electric field strength vector do not fall everywhere into identically oriented incidence planes with reference to the refractive axicon surfaces in the case of linearly polarized input radiation, for example. Consequently, because of Fresnel losses the incident light experiences an attenuation of the p- and s-components of the electric field strength that is a function of the location of incidence and thus locally different. This means that incidences of varying attenuation can occur on axicon surfaces in the azimuthal direction (circumferential direction). This leads in the case of a homogeneous intensity distribution of the entrance light to a light distribution downstream of the axicon system that is no longer spatially homogeneous. Estimates show that for conventional axicon systems and linearly polarized input light, the energy inhomogeneity caused thereby can certainly be of the order of magnitude of up to approximately 10%.

The compensation means counteract this. In this case, the anisotropically acting compensation means are aligned azimuthally, that is to say in the circumferential direction relative to the optical axis, relative to an axicon element in such a way that a light beam that passes through a region of particularly low transmission (or high reflection) at the axicon element or on the axicon surface thereof passes through a region of relatively high transmission (or low reflection) in the region of the compensation means, and vice versa. Consequently, transmission losses can be evened out over the entire cross section of the optical system equipped with the axicon system, and transmission inhomogeneities can be reduced or largely avoided.

In particular, the compensation means that act on the incident radiation have a substantially elliptic efficiency characteristic with reference to the optical axis, in the case of which two maxima occur in the azimuthal direction (circumferential direction) in the transmission (or reflection), and two minima occur in each case at a right angle thereto in the transmission (or reflection). A continuous transition can exist between these regions, and a stepped transition is also possible, if appropriate.

In accordance with a development, at least one optical surface of the axicon system is occupied by an optical compensation coating for the spatially dependent compensation of the transmission inhomogeneities of the axicon system caused by polarization-selective reflection at the axicon surface.

The compensation coating, which can be, for example, a gray filter layer or a multilayer interference layer system having alternating high-index and low-index dielectric individual layers, is ideally designed such that with reference to reflection losses it essentially produces in a spatially resolving fashion an effect that is reciprocal to that of the uncoated axicon system.

The efficiency characteristic can be set, for example, by a variation of the layer thickness that can exhibit azimuthally a complete two-fold sinusoidal course. As an alternative or in addition it is also possible to produce a variation in the layer composition over the azimuthal angle. For a given entrance intensity distribution, the required profile of the layer properties of an interference layer system can be derived from the Fresnel formulas. It is advantageous in the case of interference layers on transparent optical components when they have a reflection-reducing (antireflection) effect overall.

In addition to the axicon surface, transparent axicon elements have a further surface, which can be fashioned to be substantially plane, spherical or like-wise as an axicon surface. There are embodiments in which only the axicon surface is occupied by a compensation coating. With other embodiments, only the further surface is occupied by a compensation coating. It is also possible that the axicon surface and the further surface are each occupied by a compensation coating, it being possible for the spatial distributions of the efficiencies of the compensation coatings to be coordinated with one another such that the required compensation effect is produced overall.

With embodiments that comprise a first axicon element with a first axicon surface and at least one second axicon element with a second axicon surface, the individual axicon elements can each optionally be designed to be compensated per se and thus to maintain transmission, or the axicon elements can in each case have inhomogeneous transmission characteristics that compensate one another largely or completely in order for the axicon system as a whole substantially to maintain transmission. A typical field of application of such axicon systems with at least two axicon elements whose axial distance can be varied, if appropriate, from a distance of zero up to relatively large distances continuously or in steps is illuminating systems of the type mentioned at the beginning that can be used in microlithography projection exposure apparatuses.

If an axicon element or an axicon system is not intrinsically compensated and therefore largely maintains transmission, the axicon element or axicon system can also be assigned at least one further optical component that exhibits a transmission inhomogeneity, for example an elliptic transmission function, that is spatially complementary to the axicon element or to the axicon system. At least one separate compensation filter element, for example, can be provided.

If the axicon system is used in an illuminating system, in particular in an illuminating system of a microlithography projection exposure apparatus, it is generally desired that there be a very uniform illumination at the exit of the illuminating system. For this purpose, it is customary to use light mixing elements that can be arranged upstream or downstream of an axicon system. If a rod integrator of rectangular cross section and different edge lengths is used as light mixing element, it is possible to achieve an automatic compensation of the anisotropic transmission of an axicon system by virtue of the fact that when linearly polarized light is being used its preferred polarization direction is aligned obliquely to the lateral surfaces of the rod integrator, in particular at an angle of approximately 45°. Since, when no suitable compensation measures are provided, such rectangular rod integrators mix the light by total internal reflection such that an energetically elliptic pupil can be produced (compare DE 10065198.1, corresponding to US 2002/0126931 A1 from the applicant), it is possible to compensate for transmission of the combined system composed of axicon system and light mixer by suitable design of this elliptic operating mode with reference to the axicon system.

The above features and further ones emerge not just from the claims but also from the description and the drawings, it being possible for the individual features to be respectively implemented on their own or collectively in the form of subcombinations in the case of an embodiment of the invention and to be implemented in other fields, and for them to constitute advantageous designs and designs which can be protected in themselves.

BRIEF DESCRIPTION OF THE DRAWINGS

FIG. 4 shows a diagrammatic illustration of a third embodiment of an axicon system;

FIG. 5 shows a diagrammatic illustration of a fourth embodiment of an axicon system;

DETAILED DESCRIPTION OF THE PREFERRED EMBODIMENTS

The following exemplary examples of embodiments of the invention illustrate optical beam transformation system designed for transforming an entrance light distribution striking an entrance surface of the optical beam transformation system into an exit light distribution emerging from an exit surface of the optical beam transformation system by radial redistribution of light intensity and illuminating systems including such beam transformation systems. The transformation elements effecting the radial redistribution are generally designed as axicon elements. Optical transformation elements other than axicon elements my replace an axicon element in an embodiment, if desired.

Figure 1:
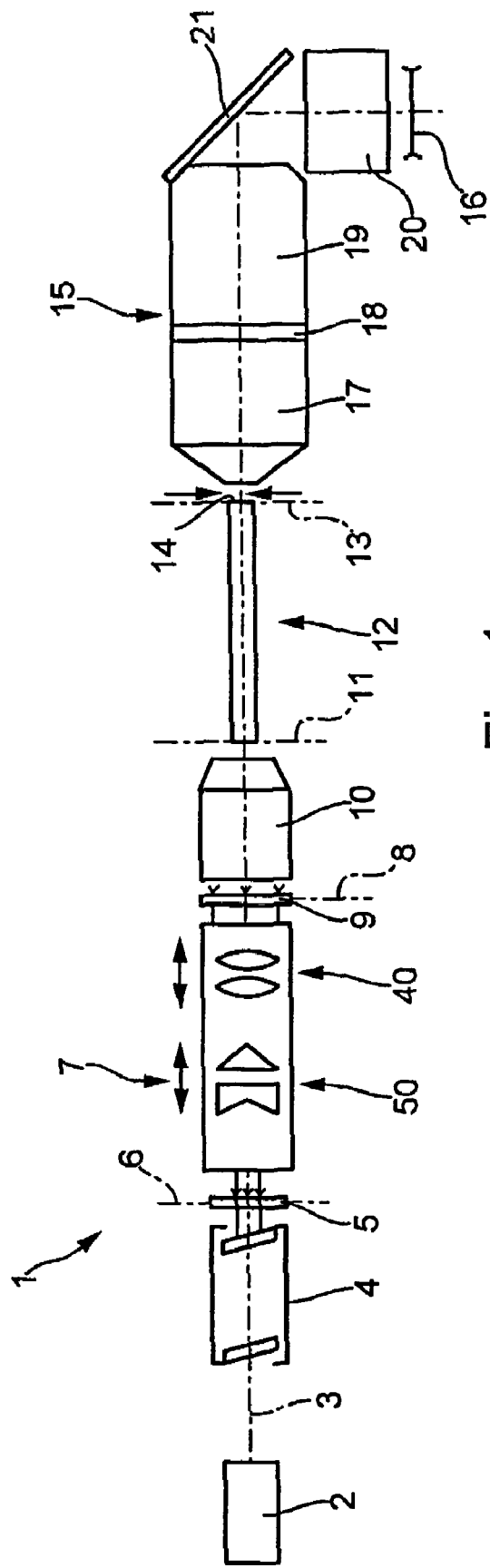
FIG. 1 shows a diagrammatic overview of an embodiment of an illuminating system for a microlithography projection exposure apparatus in which an embodiment of an axicon system is installed.

FIG. 1 shows an example of an illuminating system 1 of a microlithographic projection exposure apparatus which can be used in the production of semiconductor components and other finely structured subassemblies, and operates for the purpose of achieving resolutions of up to fractions of micrometres by using light from the deep ultraviolet region. Serving as light source 2 is an $F_2$ excimer laser with an operating wavelength of approximately 157 nm, whose light beam is aligned coaxially with the optical axis 3 of the illuminating system. Other UV light sources, for example ArF excimer lasers with a 193 nm operating wavelength, KrF excimer lasers with a 248 nm operating wavelength or light sources with wavelengths below 157 nm, are likewise possible.

The linearly polarized light from the light source 2 firstly enters a beam expander 4, which can be designed, for example, as a mirror arrangement in accordance with DE 41 24 311, and serves the purpose of reducing coherence and enlarging the beam cross section. An optionally provided closure is replaced in the case of the embodiment shown by an appropriate pulse controller of the laser 2.

A first diffractive, optical raster element 5 serving as beam shaping element is arranged in the object plane 6 of an objective 7 which is arranged downstream thereof in the beam path and in whose image plane 8 or exit pupil a refractive second optical raster element 9 is arranged which likewise serves as beam shaping element.

A coupling optical system 10 arranged downstream thereof transmits the light onto the entrance plane 11 of a light mixer 12 which mixes and homogenizes the penetrating light. Situated directly at the exit plane 13 of the light mixer 12 is an intermediate field plane in which a reticle/masking system (REMA) 14 is arranged which serves as an adjustable field stop. The subsequent objective 15 images the intermediate field plane with the masking system 14 onto the reticle 16 (mask, lithographical original) and includes a first lens group 17, a pupil intermediate plane 18, into which filters or stops can be introduced, a second and a third lens group 19 and 20 and, therebetween, a deflecting mirror 21 which permits the large illuminating device (approximately 3 m long) to be installed horizontally and the reticle 16 to be mounted horizontally.

Together with a catadioptric projection objective (not shown) with a polarization-selective beam splitter (beam splitter cube, BSC) and an adjustable wafer holder which holds the reticle 16 in the object plane of the projection objective, this illuminating system forms a projection exposure apparatus for the microlithographic production of electronic subassemblies, but also of optically diffractive elements and other microstructured parts.

The design of the parts upstream of the light mixer 12, in particular of the optical raster elements 5 and 9, is selected such that a rectangular entrance surface of the light mixer is illuminated largely homogeneously and with the highest possible efficiency, that is to say without substantial light losses apart from the entrance surface. For this purpose, the parallel light beam coming from the beam expander 4 and having a rectangular cross section and a divergence lacking rotational symmetry is firstly varied by the first diffractive raster element 5 with the introduction of photo-conductance (etendue) with reference to divergence and shape. The linear polarization of the laser light remains largely constant in this case.

The first optical raster element 5, arranged in the front focal plane (object plane) of the objective 7, prepares together with the objective 7 an illuminating spot of variable size and light distribution in the exit pupil or image plane 8 of the optical system 7. Arranged here is the second optical raster element 9, which is designed in the example as a refractive optical element with a rectangular emission characteristic. This beam shaping element produces the main component of the photo-conductance and adapts the photoconductance via the optical coupling system 10 to the field coverage, that is to say to the rectangular shape of the entrance surface of the rod integrator 12.

The design of the previously described illuminating system with the exception of the objective 7 can correspond, for example, to the design described in EP 0 747 772, whose disclosure content is to this extent incorporated in the content of this description by reference.

The objective 7, which is also designated below as a zoom/axicon system, includes a polarization-maintaining axicon system 50 which can be set variably and serves the purpose of transforming an entrance light distribution striking its entrance surface into an exit light distribution emerging from an exit surface by radial redistribution of light intensity, and also includes a zoom system 40, likewise settable, for variably setting the diameter of a light distribution output by the zoom system. Consequently, an essentially round illuminating spot of largely uniform intensity and with a settable diameter or a desired light distribution having an intensity which is increased outside the optical axis relative to the axial region can optionally be produced at the entrance surface of the raster element 9, for example in the form of a ring with a variable inside and outside diameter.

Figure 2:
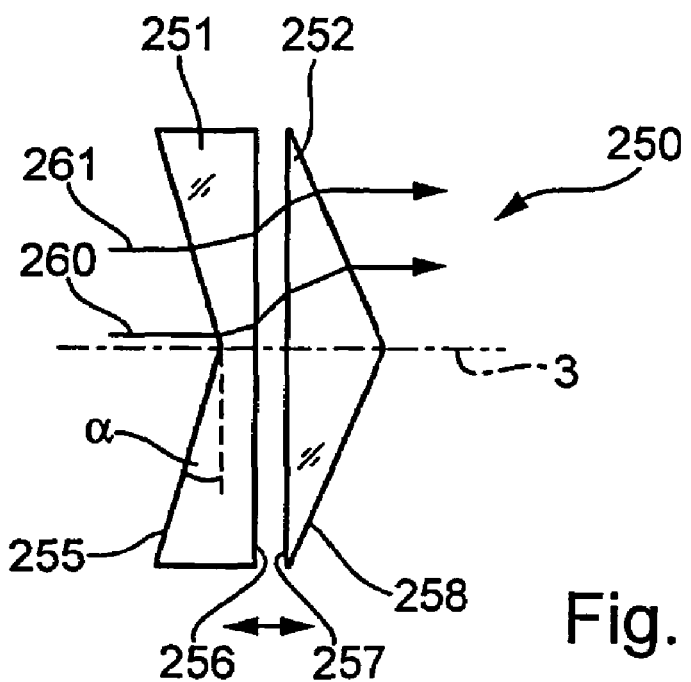
FIG. 2 shows a diagrammatic illustration of a first embodiment of an axicon system.

FIG. 2 shows a first embodiment of a substantially polarization-maintaining axicon system 250. It comprises a first axicon element 251 and a second axicon element 252, which is arranged downstream thereof in the direction in which the light runs and whose axial spacing can be infinitely adjusted by means of an adjusting device (not shown) and, if appropriate, can be reduced to a spacing of zero. The first axicon element 251 has a concave conical entrance surface 255 which forms the entrance surface and first axicon surface of the axicon system, as well as a substantially planar exit surface 256. The inclination angle α of the axicon surface, which is measured between a plane perpendicular to the optical axis and a tangent plane at the cone, is approximately 20° to 25°. The second axicon element 252 has a substantially planar entrance surface 257 and a convex conical exit surface 258 which forms the exit surface of the axicon system and at the same time its second axicon surface. The inclination angle is likewise in the range from 20° to 25°. The planar surfaces 256, 257 are intermediate surfaces of the axicon system.

The arrangement shown permits the beam deflection, required for the axicon function, away from the optical axis to be distributed radially outwards to more than the previously customary surfaces. The angles of incidence or incident angles at the individual surfaces can thereby be reduced. The problem of polarization with conventional axicon systems which was explained at the beginning is thereby reduced.

In detail, the function of the axicon system 250 is explained with the aid of two beams 260, 261 radiated onto the axicon system in an axially parallel fashion. The beams running parallel to the optical axis are deflected radially outwards by refraction at the first axicon surface 255, the deflection angle being yielded by the law of refraction. Inside the first axicon element, the radiation therefore already runs no longer in an axially parallel fashion at an angle differing substantially from 0° to the optical axis, and strikes the planar exit surface 256, which is perpendicular to the optical axis, at this angle. Since the radiation striking the planar intermediate surface 256 from the optically dense medium already strikes at an angle to this planar surface, the first planar intermediate surface 256 also has a refracting action and deflects the light at a larger deflection angle radially outwards. This light running obliquely to the optical axis now strikes the planar intermediate surface 257 running perpendicular to the optical axis, the radiation being deflected towards the normal during transition from the optically thin to the optically denser medium. A further deflection is performed when the beam exits at the axicon surface 258, which is the exit surface of the axicon system, its inclination angle being dimensioned such that the emerging radiation runs substantially parallel again to the optical axis.

This axicon system therefore has four optical surfaces which in each case effect a substantial deflection of the penetrating radiation. Thus, four surfaces contribute to the required overall deflection, and this relaxes the requirements placed on each individual surface. As a result, above all at the conical surfaces 255, 258, the radiation can strike these surfaces with incident angles which have a large spacing of, for example, 15°, 20° or 25° from the associated Brewster angle. As a result, by comparison with conventional systems, the splitting of the polarization at the axicon surfaces is substantially reduced such that the state of polarization of the emerging light does not differ, or differs to an only negligibly slight extent, from the state of polarization of the entrance light. The axicon system thus acts largely to maintain polarization and outputs largely linearly polarized light.

Figure 3:
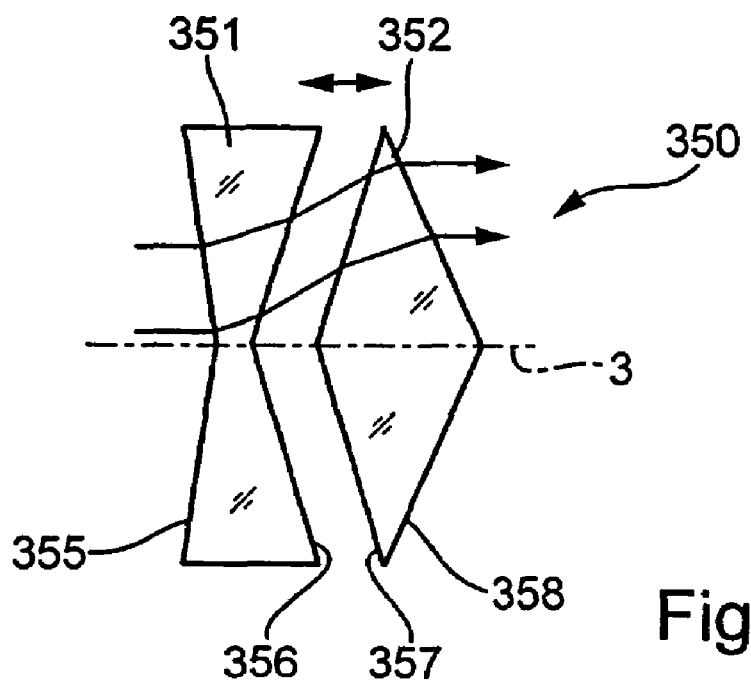
FIG. 3 shows a diagrammatic illustration of a second embodiment of an axicon system.

In the second embodiment, shown in FIG. 3, of an axicon system 350, the corresponding surfaces and elements bear the same reference numerals as in FIG. 2, increased by 100. By contrast with the first embodiment, both the first axicon element 351 and the second axicon element 352 are double axicon elements, because both the respective entrance surfaces 355, 357 and the respective exit surfaces 356, 358 are conical axicon surfaces. The maximum inclination angles of the conical surfaces are in turn of the order of magnitude of between 20° and 25°. As in the case of the above embodiment, light arriving in parallel at all the optical surfaces 355, 356, 357 and 358 of the axicon system is deflected substantially, the two first deflections at the concave first axicon surface 355 and the concave first intermediate surface 356 leading to an enlargement of the angle between the light beam and optical axis, while the two last deflections at the convex second intermediate surface 357 and the convex axicon exit surface 358 reduce the beam angle again to zero in stages. Here, again, the distribution of the deflecting action over four surfaces leads to a substantial reduction in the polarization-splitting action of the individual surfaces, and so the axicon system 350 acts largely to maintain polarization.

In the third embodiment of an axicon system 450 in FIG. 4, corresponding reference numerals are increased again by 100. Here, the first axicon element 451 has a concave conical entrance surface 455 and a convex spherical (or slightly aspheric, if appropriate) exit surface 456, while the subsequent second axicon element 452 has a concave spherical (or slightly aspheric, if appropriate) entrance surface 357 corresponding to the surface 456, and a conical exit surface 458. Because of the spherically curved intermediate surfaces 456, 457, whose spacing can be adjusted, the deflecting action, which leads to a radial redistribution of light intensity, further has superimposed on it a focusing action of the axicon system such that the radiation emerging from the exit surface 458 of the axicon system runs convergently. An axicon system with an overall "positive refractive power" is thus created. Here, again, the beam deflection is advantageously distributed over all four optical surfaces of the axicon system, such that large incident angles are avoided.

The fourth embodiment of an axicon system 550 in FIG. 5 can be understood as a variant of the third embodiment. Whereas, as in the case of the third embodiment, the entrance surface 555 is concavely conical with an inclination angle between approximately 20° and 25°, the convex exit surface 556 of the first axicon element 551, which forms the first intermediate surface of the axicon system, has a complex shape. A spherical radius is admittedly likewise impressed on the exit surface 556, but in such a way that the apex of a cone is produced on the optical axis. Such an optical element, in the case of which at least one surface is curved about a plurality of axes and has a first curvature running in a circumferential direction as well as a second curvature which lies in a plane of curvature including the optical axis, is also designated here as acon lens or lensacon. The concave entrance surface 557 of the second axicon element 552 has a corresponding lensacon shape such that upon minimization of the spacing of the two axicon elements the lensacon surfaces can lie properly on one another. The exit surface 558 of the second axicon element or the axicon system is likewise formed in the manner of a lensacon, but with a slightly different inclination angle. Even in the case of this system, a slightly focusing action is produced in addition to the radial redistribution of the incoming optical radiation.

Figure 6:
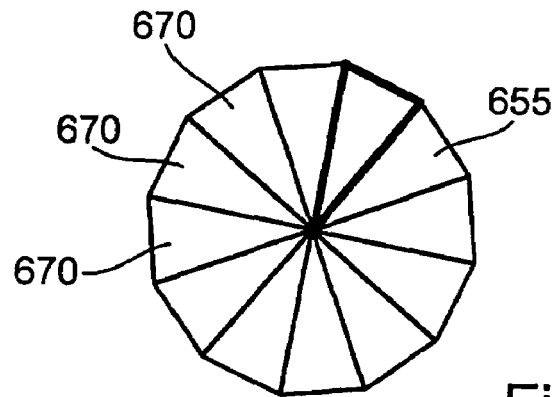
FIG. 6 shows an axial top view of a facetted axicon surface of a fifth embodiment of an axicon system.

FIG. 6 shows an axial top view of an axicon surface 655 of an axicon system 650 of a fifth embodiment. The axicon element comprises a plurality of separate individual elements which are arranged circularly about the optical axis and in each case have the form of wedges. Such a wedge element of triangular shape is marked by bold lines. The individual elements arranged in the shape of a rosette can be fixed on one another and thus form with an axicon surface a pyramid element which has a polygonal pyramid shape which is assembled from a plurality of planar pyramid facets 670 which border one another or are arranged at a slight spacing from one another. It is thereby possible to create a multiple prism with a number of prism elements which are arranged in a circular arrangement such that light which comes from a point light source arranged on the optical axis runs through the prism elements and after the passage a number of component beams which corresponds to the number of prism elements is present. If, for example, four such wedge elements in the shape of a cross are used, a quadrupole distribution can be produced downstream of such a pyramid arrangement. Dipole illumination can be produced if only two prism wedges are provided. If a sufficiently high number of individual elements are provided, for example substantially more than 4, for example between 10 and 20 such individual elements, it is possible to produce a quasi-annular illumination in the circumferential direction, interrupted by small gaps if appropriate.

Figure 7:
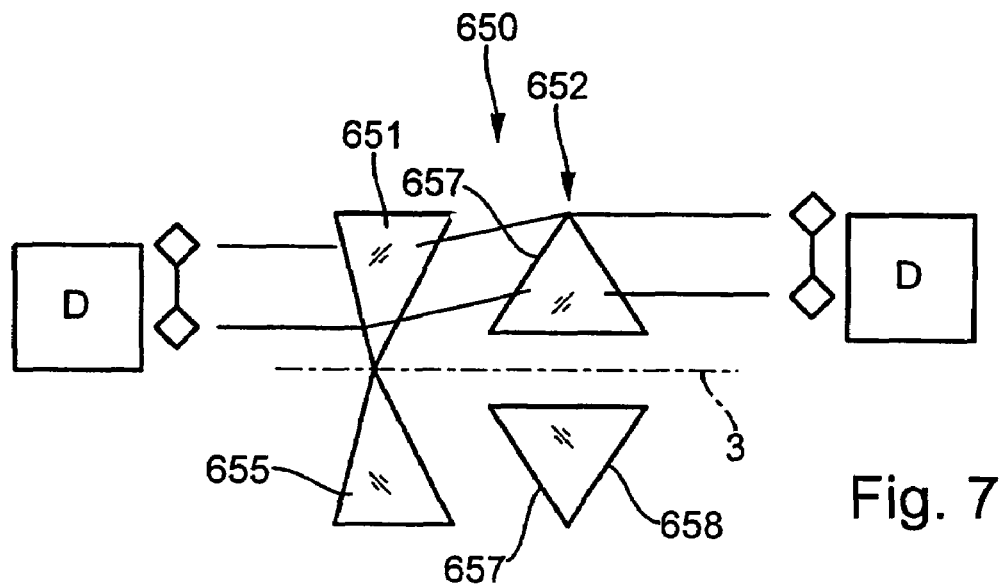
FIG. 7 shows a diagrammatic illustration of an embodiment of an axicon system having an axicon element which includes a plurality of individual elements which can be moved relative to one another and are arranged in a first configuration.
Figure 8:
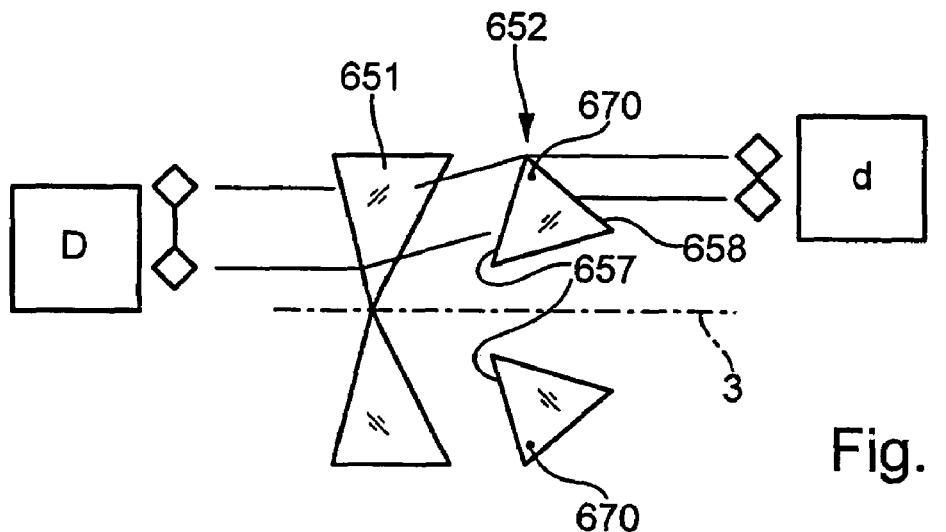
FIG. 8 shows the embodiment in accordance with FIG. 7 in a second configuration with tilted individual elements.

Illustrated in FIGS. 7 and 8 in a diagrammatic side view is an axicon system 650 which has two axicon elements 651, 652 which are arranged one behind another and comprise pyramidal individual elements. The refracting wedges are shaped and arranged with reference to the optical axis such that all the planar refracting surfaces are at an inclination angle to the optical axis. The action of such an axicon system on an abaxially incident beam of diameter D is explained in FIG. 7. Upon passage through the axicon element 651 on the entrance side, this beam is deflected from the axially parallel course into a course inclined outwards relative to the axis, while the second axicon element 652 cancels this deflection by means of two further refractive operations such that a light beam of unchanged beam diameter D is present on the exit side, its spacing from the optical axis 3 being enlarged, however (compare FIG. 3).

If, for example, at least the rear wedges are now fastened in a holder device which is designed in such a way that each of the wedge elements can be rotated about a tilting axis 670 which runs perpendicular to the radial direction in a plane running perpendicular to the optical axis, it is possible, for example, to switch over between the configuration shown in FIG. 7 and the configuration shown in FIG. 8 with the aid of swivelled individual elements of the second axicon element 652. In the case of the example, the swivelling reduces the inclination angle of the entrance surfaces 655 of the second axicon element 652, while the inclination angle of the corresponding exit surfaces 658 is enlarged. An effect of this switchover is that during the adjustment the diameter d of the exit light distribution varies continuously in accordance with the tilting angles set such that a suitable aspect ratio D/d can be set via the tilting angle of the wedge elements. In this variant as well, the deflecting action of the axicon is distributed over four surfaces, four (subdivided) pyramid faces with individual, triangular planar pyramid facets being formed in the case of the example. The arrangement shown with swivelable wedge-shaped or prismatic individual elements is also designated here as a "Brewster telescope axicon with an umbrella mechanism". It is particularly advantageous with this arrangement when both the front segments of the pyramid axicon element and the rear individual elements can be swivelled in order to construct per angular segment of the pyramid multifaceted element a complete Brewster telescope for beam widening or beam focusing.

It can, if appropriate, be regarded as a disadvantage of the system that it is no longer possible for any closed annular field to be produced, since gaps occur for geometrical reasons between the wedges of a rosette. However, this disadvantage can be taken into account by providing a suitable large number of individual elements (corresponding to a high number of "poles" produced), or it can even be advantageous for the imaging of semiconductor structures which are arranged on the structure-carrying mask, predominantly in a horizontal or vertical orientation.

When designing individual angular segments of the pyramid axicon element in the manner of a Brewster telescope, it can therefore be advantageous that individual segments or symmetrically opposite segments of neighbouring pairs of segments, with particular preference arranged rotated by 90°, can be displaced or rotated differently in the axial direction in order to illuminate different structural widths or line densities in the different directions of the structure of the mask to be imaged, with matched directions of illumination in each case.

In all the embodiments shown, but also in the case of the axicon surfaces of conventional axicon systems, it is possible to implement the functionality of individual surfaces, be they conical, spherical or lensacon surfaces, in each case by a Fresnel zone plate or a refractive optical raster element. Compact axicon systems having particularly short length dimensions which can satisfy most stringent design space requirements are thereby possible. The axial shortening of axicon systems in conjunction with maintaining the basic axicon function by replacing individual surfaces or all of them by Fresnel elements is countered as a disadvantage only by an increased layout on production for these elements. If appropriate, it is also possible further to produce a higher level of scattered light which is to be taken into account in the design.

In the case of axicon systems, in particular of an embodiment of axicon systems according to the invention, the functionality of an axicon can also be replaced by diffractive optical elements (DOEs), that is to say such optical elements whose light-influencing action is effected substantially by diffraction (by contrast with refraction of light). It is thereby possible to produce particularly compact axicon systems, in particular having small axial dimensions. Moreover, the path through the optical material is reduced, and it is possible, furthermore, to make use for this purpose if appropriate of material which is more cost-effective. Given a not too complicated shape of the diffracting structures, it is possible, if appropriate, for axicon elements to be produced more simply together with a corresponding saving in costs by comparison with conventional systems. Typical grating periods of diffractive structures could be, for example, in the range between approximately 0.3 and 0.4 µm. Diffractive optical elements can be designed, for example, as computer-generated holographic elements (CGHs). Consequently, the invention also covers an axicon system in which at least one axicon element is designed as a diffractive or refractive optical element, in particular with a two-dimensional raster structure.

The person skilled in the art can further transfer the designs according to the invention to reflective systems without any additional inventive input, such that at least one of the surfaces is of reflective design with, for example, a multiple coating. The angles of incidence of the optical elements redistributing the light intensity in the radial direction can therefore be minimized, in order also to minimize the polarization effects occurring during the reflection at multiple reflection layers such as occur, for example, in EUV lithography with wavelengths of 13.5 nm.

The term "light" in this application is therefore intended also to cover radiation in the soft x-ray region at suitable points.

Figure 9:
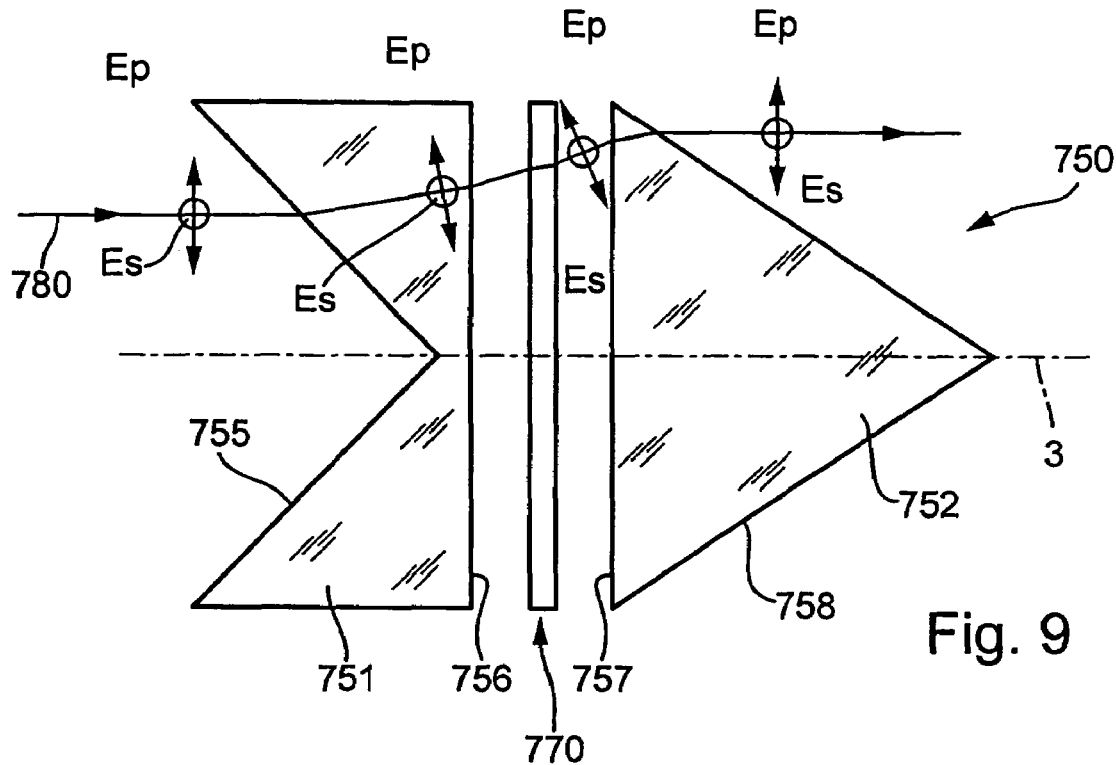
FIG. 9 shows a diagrammatic illustration of an embodiment of an axicon system having a polarization rotator between axicon surfaces.
Figure 10:
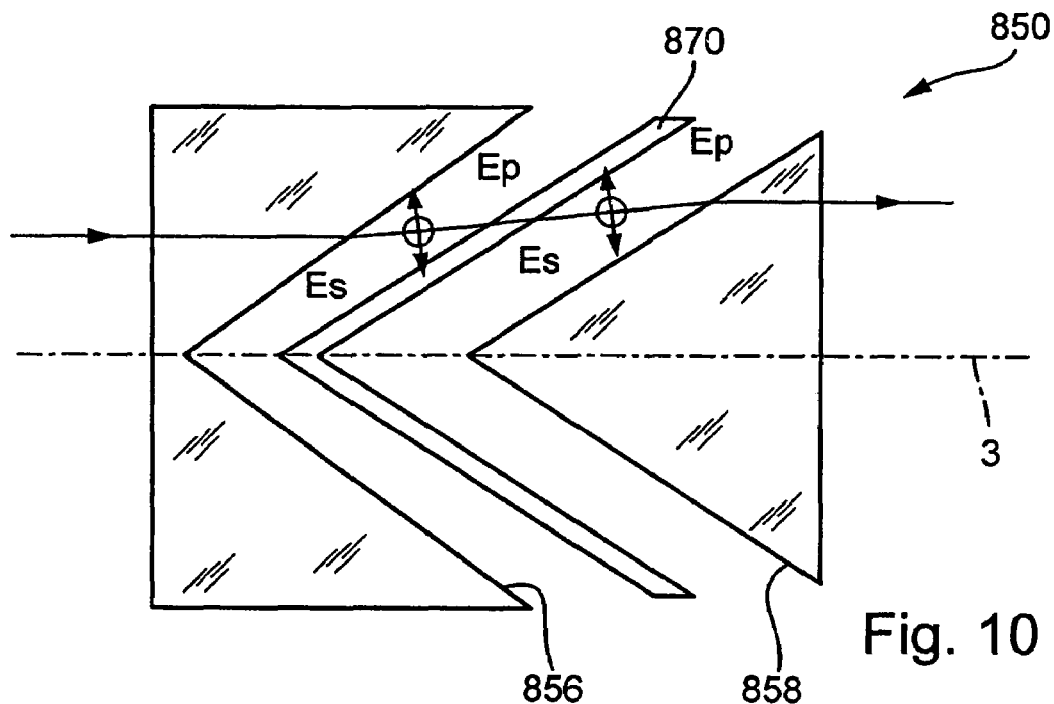
FIG. 10 shows another embodiment of an axicon system having a polarization rotator between consecutive axicon surfaces.

FIGS. 9 and 10 are used to explain further variants of axicon systems according to the invention, in the case of which at least one intermediate surface is arranged between a first and a second axicon surface. In these exemplary embodiments, at least one polarization rotator which is bounded by intermediate surfaces is provided between axicon elements (that is to say optical elements with axicon surfaces).

The axicon system 750 in FIG. 9 has a first axicon element 751 with a conical entrance surface 755 and planar exit surface 756, as well as a second axicon element 752 with a planar entrance surface 757 and conical exit surface 758, it being possible for the inclination angles or conical angles of the axicon surfaces 755, 758 to be equal or different. A polarization rotator 770 in the form of a λ/2 plate consisting of a birefringent material is arranged between the axicon elements.

In order to explain the function, there is illustrated in FIG. 9 a light beam 780 which traverses the axicon arrangement with an integrated polarization rotator. The electric field strength E of the light beam is composed of a component $E_s$, which oscillates perpendicularly to the plane of incidence lying in the plane of the paper, and a component $E_p$, which oscillates parallel to the said plane of incidence. The light beam incident parallel to the optical axis is deflected radially outwards by a deflection angle through refraction at the entrance surface 755 of the axicon system, thereafter traverses the planar exit surface of the first axicon element while being further deflected outwards, thereafter traverses the delay plate 770 while producing a slight parallel offset, thereafter strikes the planar entrance surface of the second axicon element 752, is deflected at said entrance surface with reduction of the beam angle relative to the optical axis, and emerges from the second axicon surface 758, being in the process deflected again at the latter in the direction of the optical axis such that it runs in a substantially axially parallel fashion downstream of the axicon system, but at a greater spacing from the optical axis. The components $E_s$ and $E_p$ are attenuated differently in accordance with the Fresnel losses (reflection losses) at the entrance surface 755, which can, if appropriate, have an inclination angle in the range of the associated Brewster angle. A similar thing happens in the attenuated form upon exit from the first axicon element, since here the light strikes the boundary surface at a lesser angle of incidence. In the absence of the polarization rotator 770, the rectified components would be attenuated anew upon entry into the planar entrance surface of the second axicon element and to a greater extent upon exit from this element.

As a result of the polarization rotator 770, the stronger p-component upstream of the λ/2 plate 770 and the weaker s-component upstream of the plate are respectively rotated by 90°. Before entrance into the second axicon element, the weaker component then runs parallel to the plane of incidence, while the stronger component runs perpendicular to the latter. Upon traversing the two boundary surfaces of the second axicon element, the stronger field component is now respectively more strongly attenuated than the weaker one, such that after passage through the axicon system in the ratio of the field strengths $E_p$ and $E_s$ no variation, or only a negligible one, has resulted overall. Both components are thus attenuated overall with an approximately equal strength by the axicon system, such that no change is produced in the spatial distribution of the state of polarization, and the axicon system consequently acts to maintain polarization.

The axicon system 850 in accordance with FIG. 10 likewise acts in a substantial way to maintain polarization by means of a corresponding measure (arrangement of a polarization rotator 870 between the first axicon surface 856 and the second axicon surface 857). By contrast with the above embodiment, however, the axicon surfaces 856, 857 face one another. Consequently, they can be moved towards one another up to a slight axial spacing, as a result of which very small annular diameters of the exit radiation are also rendered possible. The polarization rotator 870 is designed in the case of the example as an axially thin, doubly conical element. Sufficiently thick and thus mechanically stable and reliably producible doubly conical elements are permitted by fabrication from only slightly birefringent material, for example from <110>-orientated calcium fluoride and/or by a design as a multiorder plate with a delay of an odd multiple of λ/2.

Alternatively, the λ/2 plate can be applied directly by means of coating methods to one of the intermediate surfaces, or a polarization-dependent delaying action which corresponds to the delaying action of a λ/2 plate can be set on at least one of the layers applied to a plurality of intermediate layers by means of coating methods.

If the production of rotationally symmetrical conical lenses is not desired, it is possible to go over to a polygonal design of "conical lenses" which can be fashioned in accordance with the multifaceted shape of the axicon surfaces in FIG. 6, for example hexagonally or with more or fewer than six wedge faces. The λ/2 plates can also be snapped on in this case.

A delay element (retardation element) having only four pyramid faces can suffice given complete linear polarization at the entrance of the axicon system with the direction of oscillation of the electric field strength perpendicular or parallel to one of the axicon surfaces. It is possible to arrange for the light to have only a pure s-component or a pure p-component at a surface and the respective opposite axicon surface given suitable alignment of these surfaces relative to the preferred direction of polarization. Consequently, no rotation of the polarization is required at these surfaces. Moreover, given a pure p-polarization, the Fresnel losses are minimized in the case of the reflections at the associated axicon surfaces, above all when the incident radiation strikes this surface substantially at the Brewster angle.

It can be favourable to arrange in the optical delay system a further optical delay element which introduces a delay of half a wavelength between two mutually orthogonal states of polarization. The optical delay element can be, for example, a half-wave plate, a birefringent optical element or a coating on an optical element whose action corresponds to that of a half-wave plate. The fast axis of the first optical delay element should in this case enclose an angle of 45°±5° with the fast axis of the second optical delay element. An angle of 45° is ideal. The term "fast axis" is known from polarization optics. The advantage of two mutually rotated delay elements consists in that two mutually orthogonal states of polarization of a beam are transposed by the optical delay system, this being done specifically irrespective of the state of polarization of the incident beam. Thus, in the case of a beam pencil with beams having different states of polarization, it is possible in the case of all the beams to transpose the two mutually orthogonal states of polarization. A single appropriately orientated delay element would suffice if all the beams of the beam pencil have the same state of polarization. If use is made of two delay elements, the latter can, for example, be joined seamlessly or wrung onto one another.

It is also possible within the scope of the invention for the axicon system to be supplemented by one or more radially polarization-rotating arrangements which can comprise delay elements which are arranged in a raster and have a suitable orientation of their crystallographic axes, as are disclosed, for example, in EP 0 764 858. In the case of such a raster arrangement of delay elements, the individual delay elements can also be shaped like pieces of cake in a number which corresponds to the number of individual elements of a polygonal axicon. If such a raster arrangement is fitted on the exit side of an axicon system, an approximated radial or tangential distribution of polarization can be produced in the output radiation. The possibility of installing and removing such λ/2 triangular plates in a flexible way, for example by means of an automatic changing device, then permits a changeover between radial and tangential output polarization of the axicon system.

Figure 11:
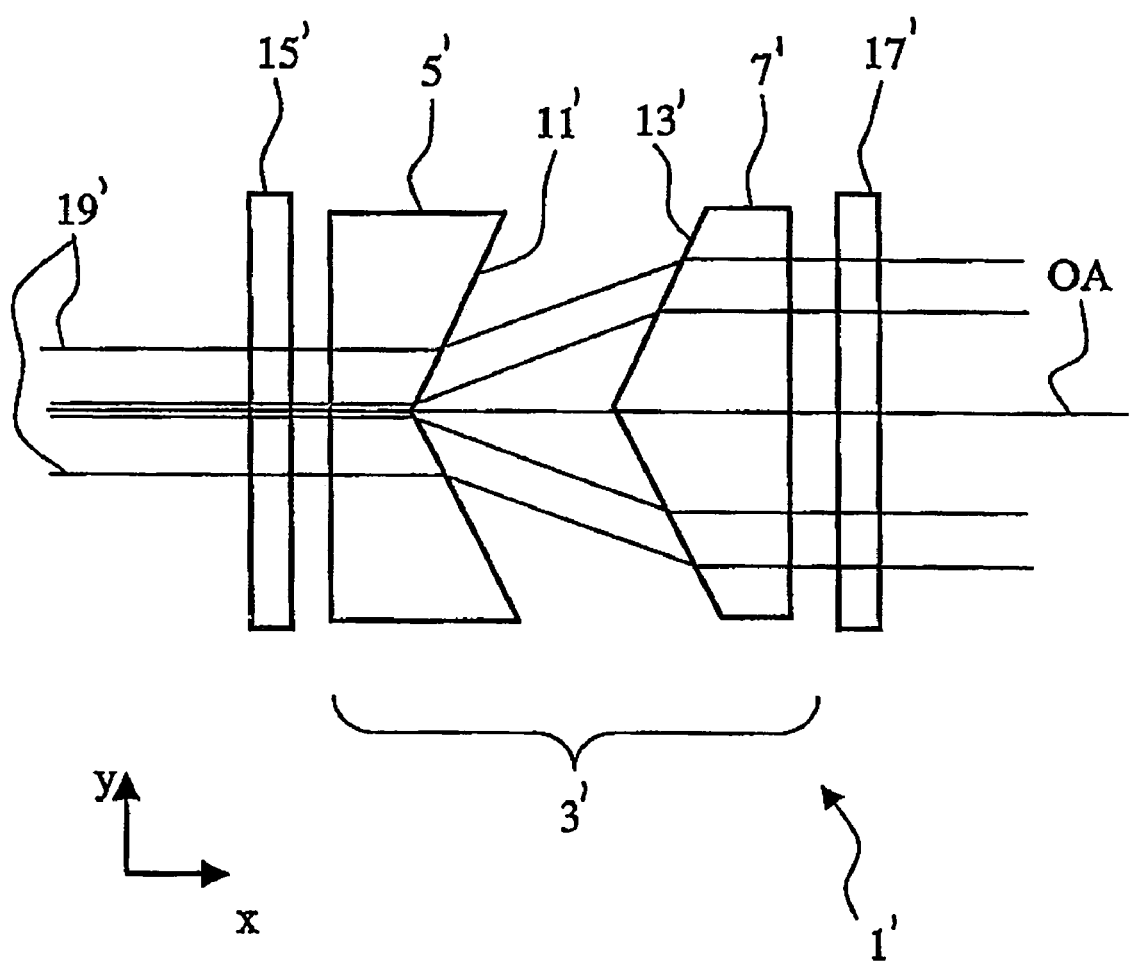
FIG. 11 shows a schematic of an illuminating system comprising an axicon module with axicon elements exploded.

Of the illuminating system 1', FIG. 11 shows the axicon module 3' and the two polarization-influencing elements 15' and 17'. The illuminating system 1' generally has yet further optical elements, which are described in conjunction with FIG. 21. The axicon module 3' comprises the two axicon elements 5' and 7', which have the axicon surfaces 11' and 13'. The axicon surface 11' is concave and has a scattering effect here on the rays 19', while the axicon surface 13' is convex and acts to collect the rays 19'. The axicon surfaces 11' and 13' have a conical shape in the exemplary embodiment of FIG. 11. An annular illumination distribution results downstream of the axicon module 3' owing to the spacing of the two axicon elements 5' and 7' along the optical axis OA. The optical surfaces of the axicon module are designed such that rays 19' parallel to the optical axis run parallel to the optical axis again downstream of the axicon module 3'. Those surfaces of the axicon elements 5' and 7' that are arranged opposite the axicon surfaces 11' and 13' are plane. They can, however, also be curved, as is the case with the axicon module in DE 44 21 053. The angle of inclination of the two axicon surfaces 11' and 13' to the optical axis OA is 60°. The axicon elements 5' and 7' consist of calcium fluoride in <100>- or <111>-orientation and have a refractive index of 1.55 at a wavelength of 157 nm. The Brewster angle is therefore 57.2°. The beams 19' therefore impinge on the axicon surfaces 11' and 13' virtually at the Brewster angle.

The polarization-influencing optical element 15' is arranged upstream of the axicon module 3', and the polarization-influencing optical element 17' is arranged downstream of the axicon module 3'. Their mode of operation is explained in more detail in conjunction with FIGS. 13 to 15.

Figure 12:
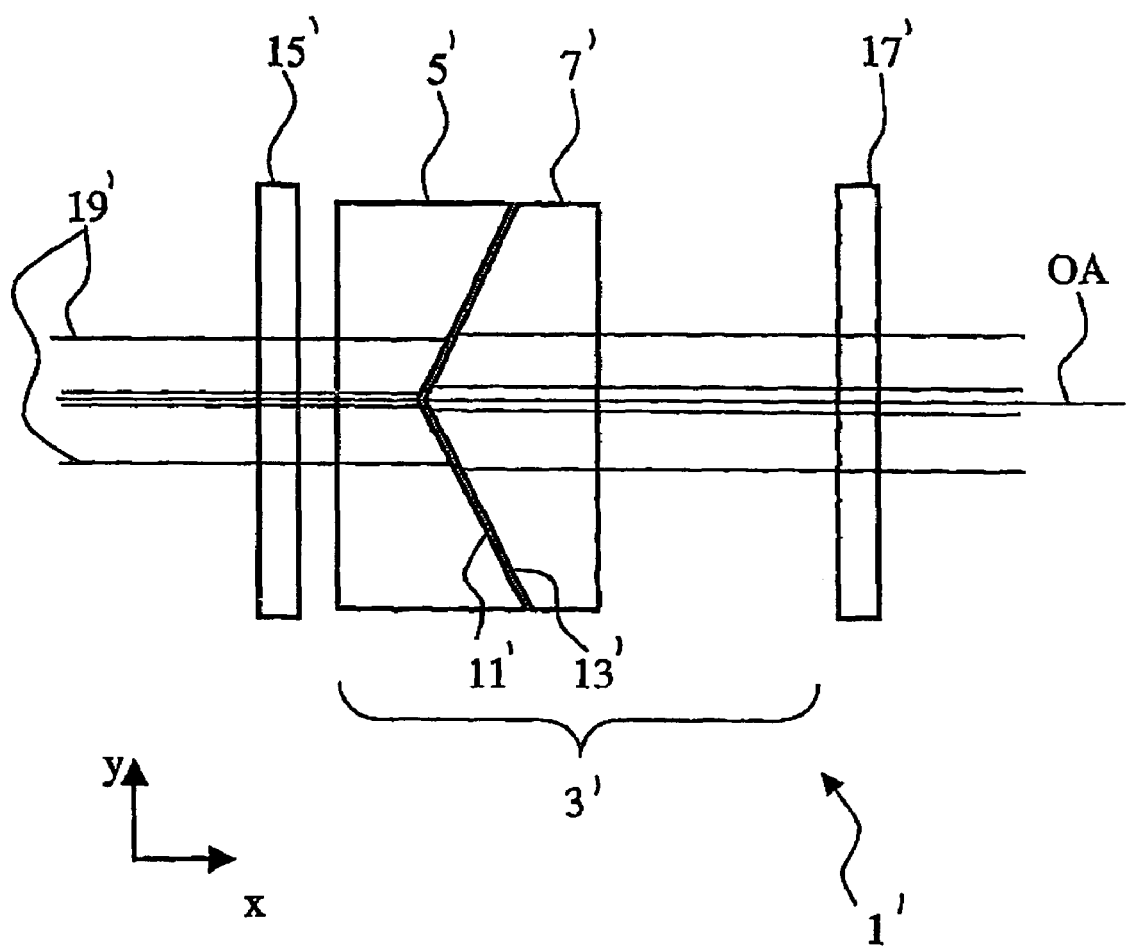
FIG. 12 shows a schematic of the illuminating system of FIG. 11 with axicon elements combined.

FIG. 12 shows the illuminating system 1' of FIG. 11 in another state. In FIG. 12, the two axicon elements 5' and 7' have a minimum spacing. The axicon module 3' thereby acts approximately like a plane-parallel plate and has virtually no influence on the course of the rays 19'. By displacing the two axicon elements 5' and 7' along the optical axis OA, it is possible to select between a conventional circular illumination as produced in the state of FIG. 12, and an annular illumination, as produced with the state of FIG. 11.

Figure 13:
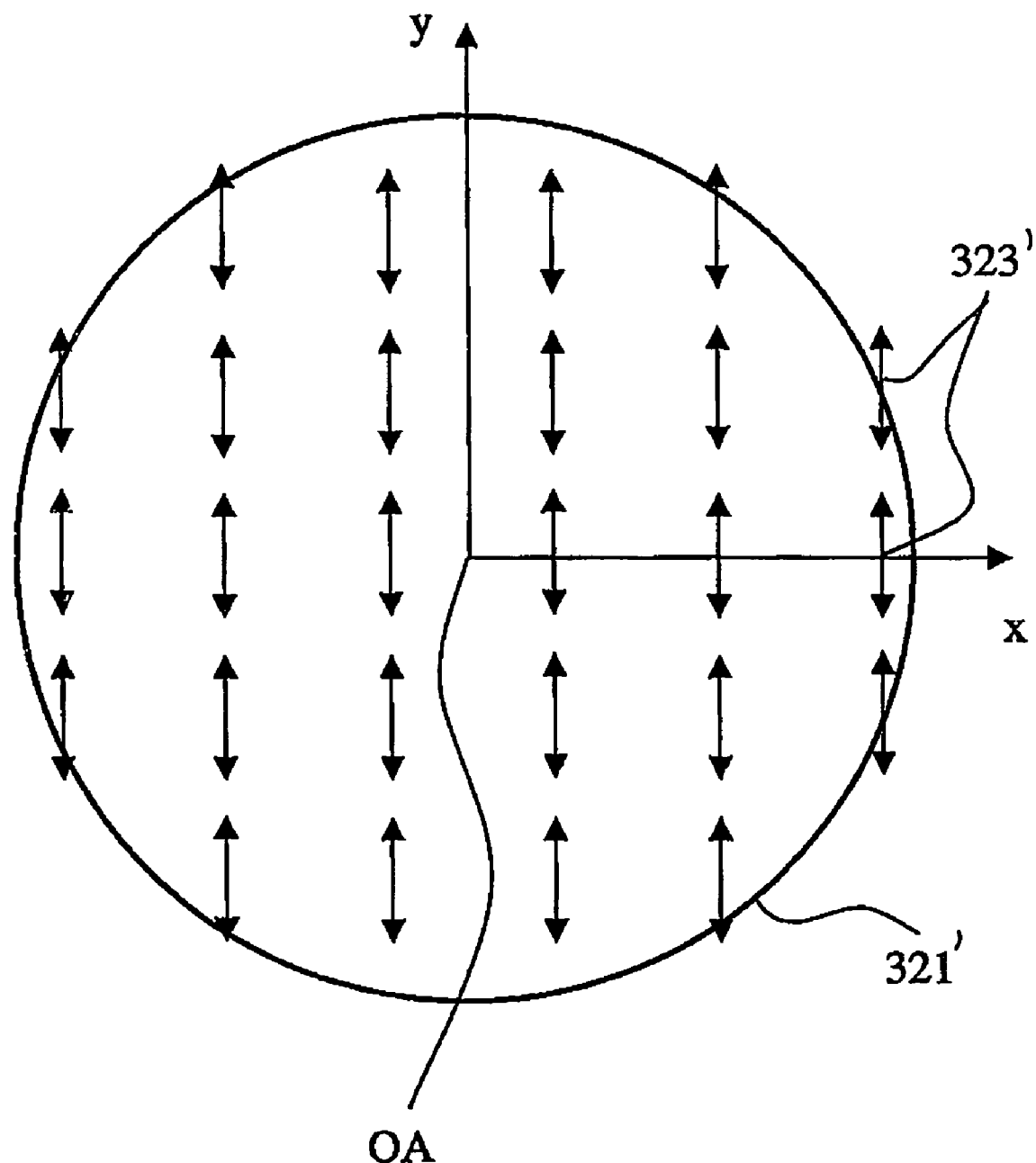
FIG. 13 shows a schematic of the polarization distribution of a ray pencil.

The rays 19', which strike the polarization-influencing optical element 15', are linearly polarized in the y-direction. This is illustrated in FIG. 13. Inside the extent of the pencil 321', the E-field vectors 323' of the rays illustrated all point in the y-direction. This polarization distribution typically results when a laser light source is used to produce the rays.

Figure 14:
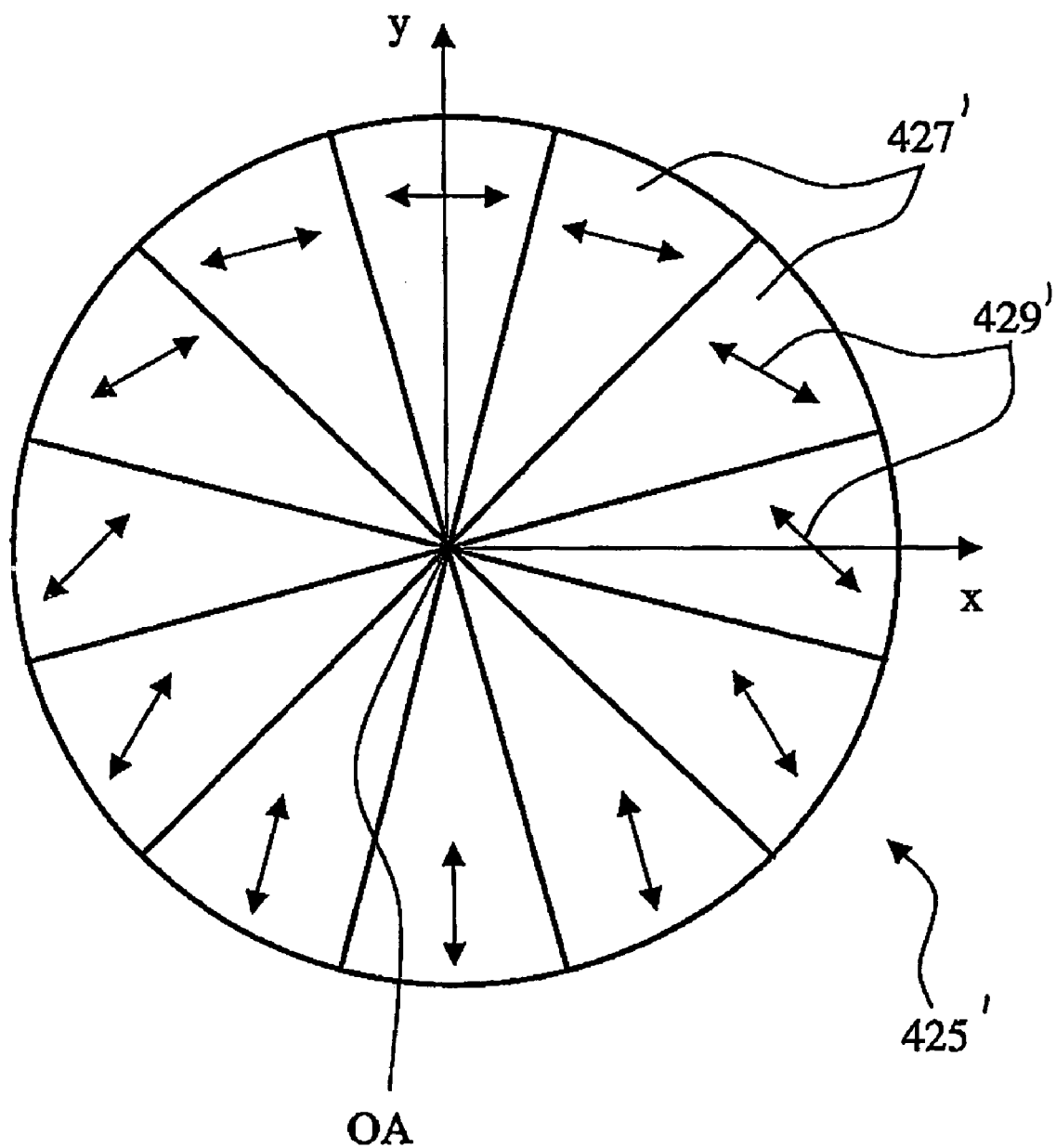
FIG. 14 shows a schematic of a first exemplary embodiment of a polarization-influencing optical element.

The polarization-influencing optical element 15' is designed and arranged such that the rays 19' are polarized radially in relation to the optical axis OA after passing through the polarization-influencing optical element 15'. A raster plate of half-wave plates such as is illustrated in FIG. 11a of DE 195 35 392, for example, can be used as polarization-optical element 15'. A further embodiment of the polarization-optical element 15' is illustrated in FIG. 14. The polarization-optical element 15' here comprises the raster plate 425' with individual half-wave plates 427'. The principal axes 429' of the half-wave plates 427' are oriented in this case such that they point in the direction of the angle bisector between the original polarization direction oriented in the y-direction and the respective polarization direction oriented radially in relation to the optical axis.

The raster arrangement 425' consists in FIG. 14 of 12 half-wave plates 427'. Of course, the number of the individual half-wave plates 427' can also be increased in order to be able to set the radial polarization distribution as well as possible. Calcium fluoride in <110>-orientation can be used as material for the half-wave plate. The half-wave plate is therefore 78.5 mm thick given an intrinsic birefringence of 10 nm/cm at a wavelength of 157 nm. A corresponding half-wave plate of zeroth order for 157 nm made of magnesium fluoride has a thickness of only 11 μm. However, the half-wave plate can also be operated in a higher order in the present case because of the low angular variance. The half-wave plate then has a thickness of approximately 0.44 mm in the twentieth order.

Figure 15:
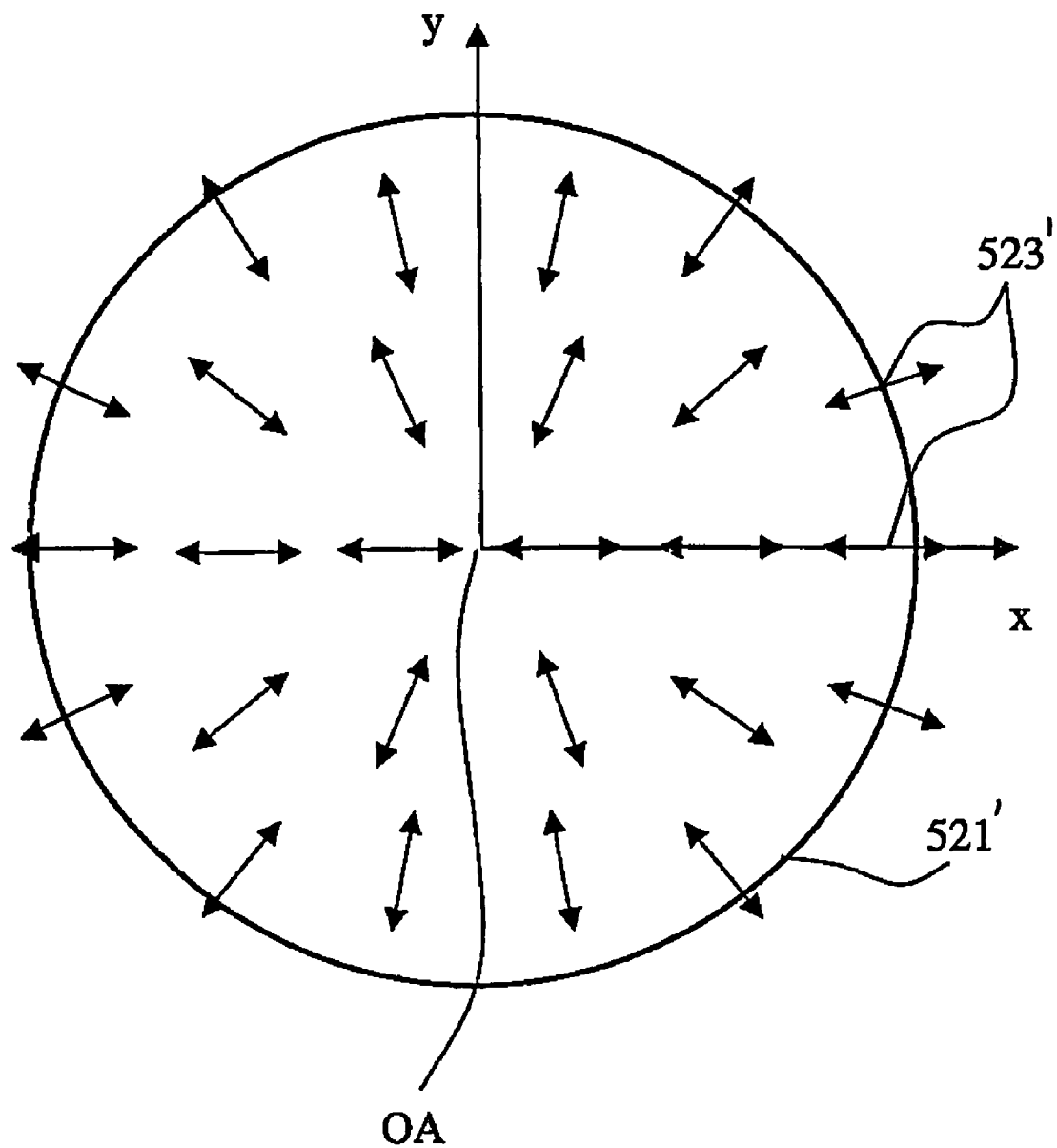
FIG. 15 shows a schematic of the polarization distribution for a ray pencil downstream of the polarization-influencing optical element of FIG. 14.

FIG. 15 shows the polarization distribution of the rays 19' downstream of the polarization-optical element 15'. The E-field vectors 523' are oriented radially in relation to the optical axis OA inside the ray pencil 521'. As a result of this, the E-field vectors are in each case oriented parallel to the incidence plane of the rays 19' on the conical axicon surfaces 11' and 13' in the axicon module 3' of FIG. 11. This results in minimum reflection losses at the axicon surfaces 11' and 13'. Furthermore, there is no variation in the polarization state upon refraction at the two axicon surfaces 11' and 13'. Without the polarization-influencing optical element 15', the light rays 19' would strike the axicon surfaces 11' and 13' in a linearly polarized fashion. Depending on the orientation of the E-field vector in relation to the incidence plane of the respective ray, reflection losses would thereby occur and the polarization state would be varied.

In order to restore the original linear polarization distribution downstream of the axicon module 3', a further polarization-influencing element 17' is arranged downstream of the axicon module 3'. This is arranged and designed such that the radial polarization distribution is transformed into a linear polarization distribution. So that the E-field vectors of the rays 19' point in the y-direction again, the polarization-influencing optical element 17' is designed the same way as the polarization-influencing element 15'. Once again, it consists, for example, of a raster arrangement of half-wave plates as illustrated in FIG. 1a in the application DE 195 35 392. Of course, the raster arrangement of FIG. 14 can also be used as a further polarization-influencing optical element 17'. The principal axes of mutually assigned half-wave plates should respectively point in the same direction in this case, since the juxtaposition of two identically oriented half-wave plates produces a single-wave plate (λ plate), and the original polarization state is thereby reconstituted.

Figure 16:
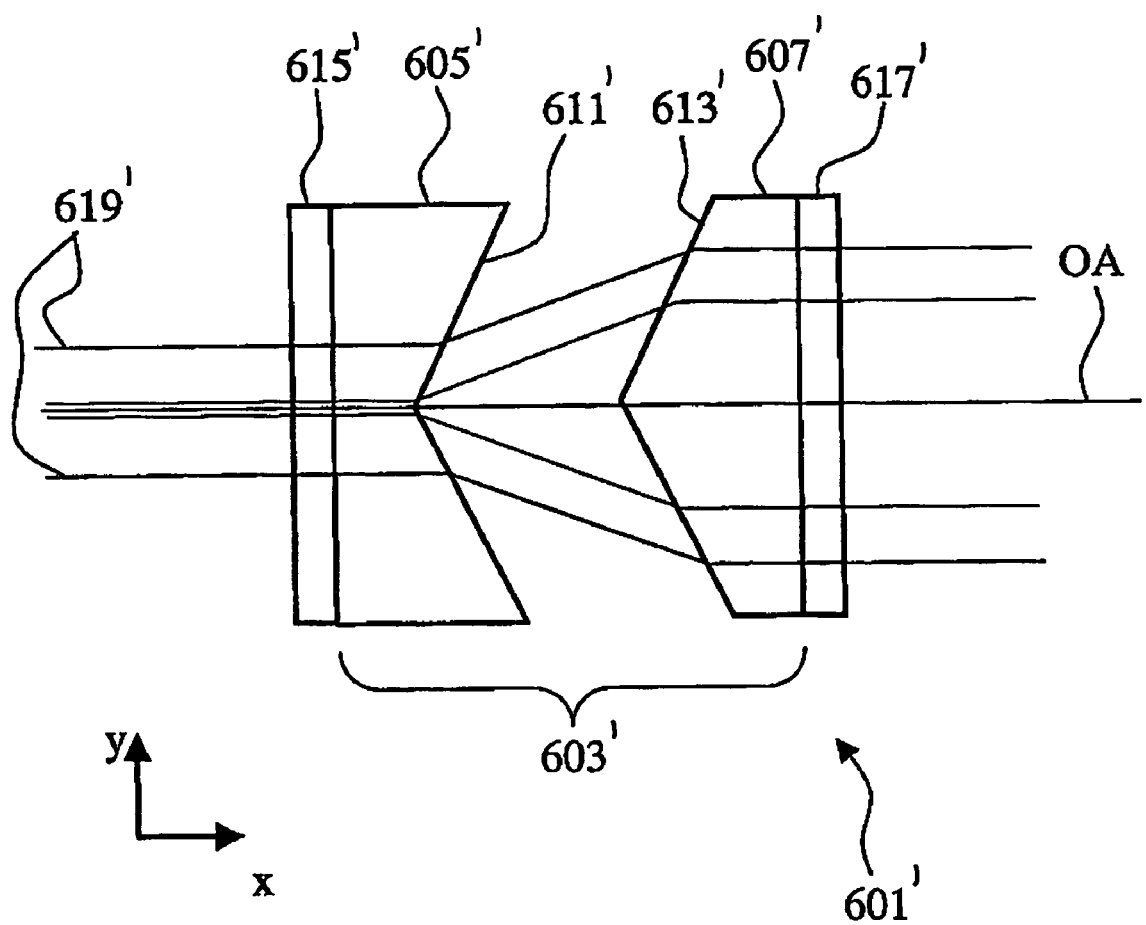
FIG. 16 shows a second exemplary embodiment of an illuminating system comprising a zoom axicon module.

A further exemplary embodiment of an illuminating system 601' is illustrated in FIG. 16. By contrast with the illuminating system 1' of FIG. 11, in this case the polarization-influencing optical element 615' and 617' are connected in an optically seamless fashion to the axicon elements 605' and 607'. This is possible by wringing, for example. The elements in FIG. 16 that correspond to the elements of FIG. 11 have the same reference numerals as in FIG. 11 but increased by the number 600. Reference is made to the description of FIG. 11 for a description of these elements. Interfaces can be saved by wringing the polarization-influencing optical elements to the axicon elements 605' and 607'. Moreover, this arrangement is advantageous when use is made of material for the half-wave plates of magnesium fluoride, which has only a slight thickness at wavelengths in the deep UV region, in order to produce the λ/2 effect. Since a half-wave plate for 157 nm made of magnesium fluoride has a thickness of only a few μm to 1 mm the problem of stable bearing can be solved by wringing to the axicon elements.

The axicon surfaces 11' and 13', or 611' and 613', have a pyramidal shape should it be desired to produce with the axicon module 3', or 603', not an annular illumination distribution, but a multipole illumination. The axicon surfaces consist of 4 pyramidally arranged plane segments in order to produce a quadrupole illumination. The angle of inclination of the segments to the optical axis OA is again 60°. Calcium fluoride can be used as material for the axicon elements.

Figure 17:
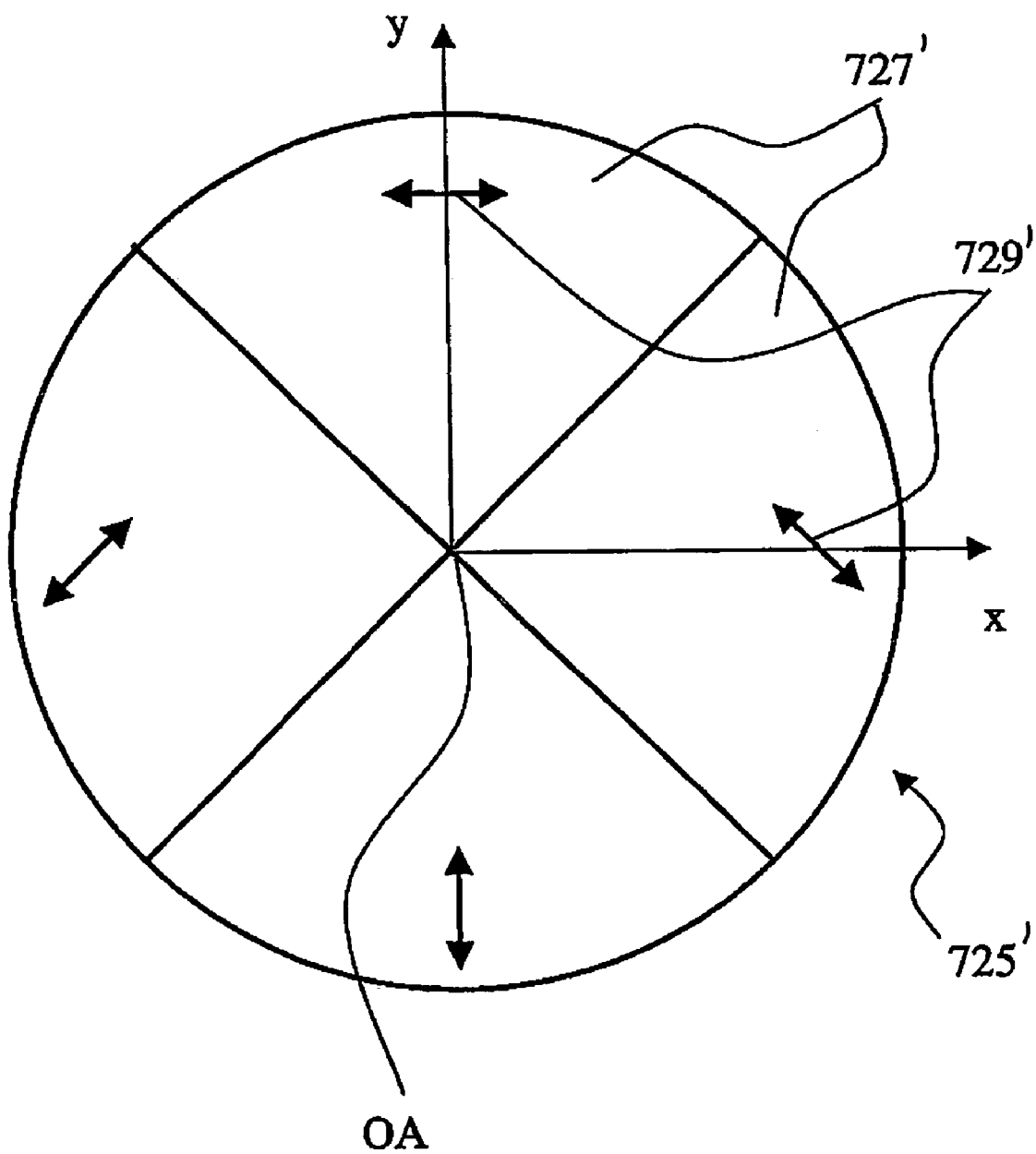
FIG. 17 shows a schematic of a second exemplary embodiment of a polarization-influencing optical element.

FIG. 17 shows a second embodiment of a polarization-influencing optical element such as is used in conjunction with pyramid-shaped axicon elements which produce a total of 4 illuminated regions along the x- and y-axes in a fashion exhibiting point symmetry in relation to the optical axis OA. The polarization-influencing optical element consists in this case of a raster arrangement 725' of 4 half-wave plates 727' that are arranged along the y- or x-axes. The principal axes 729' of the half-wave plates 727' are oriented in this case such that they point in the direction of the angle bisector between the E-field vectors, originally oriented in the y-direction, and a direction that is yielded as a line of intersection between the half-wave plate and a plane that is perpendicular to the segment assigned to the relevant half-wave plate, and includes the direction of the maximum surface gradient of this segment.

Figure 18:
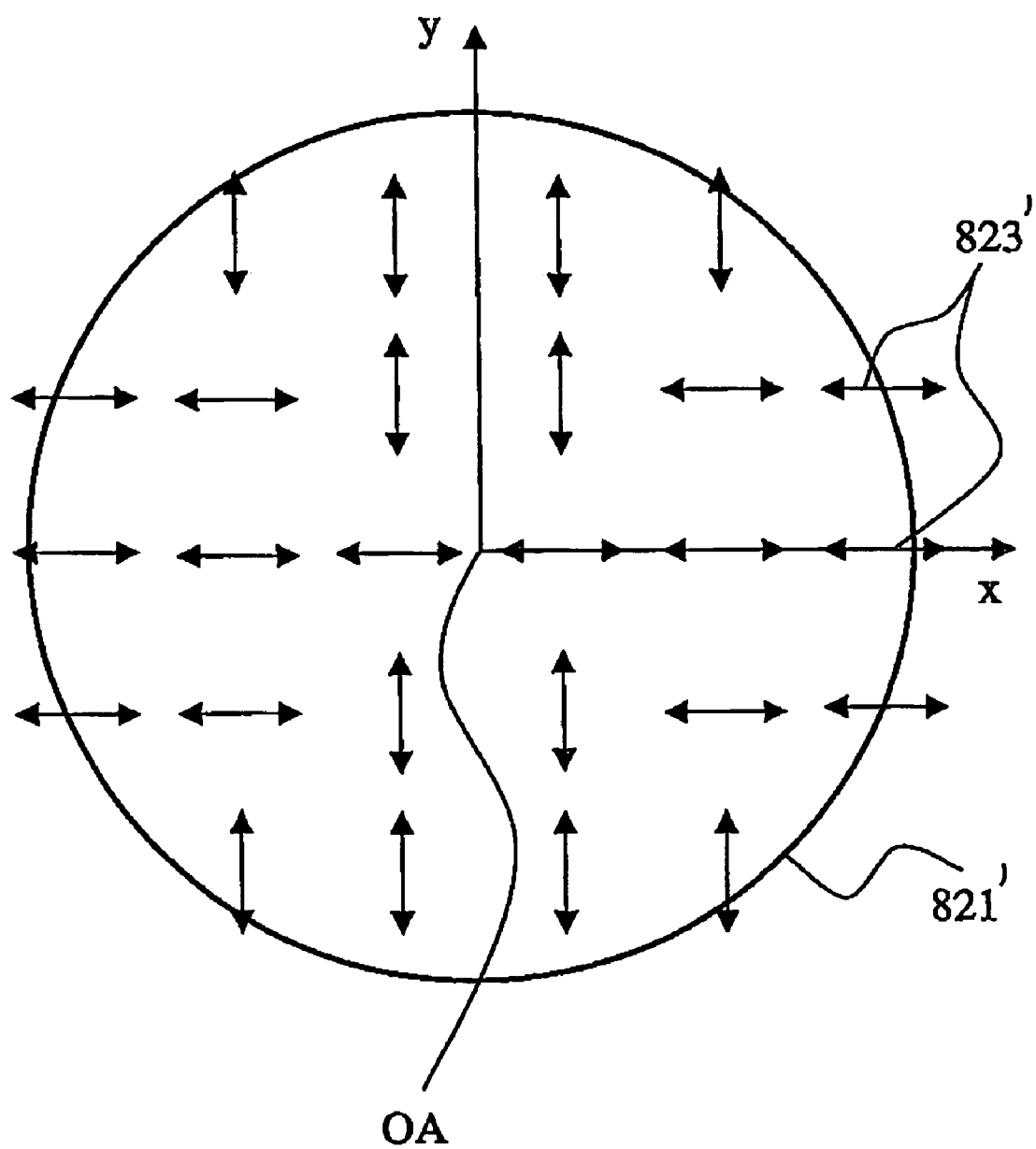
FIG. 18 shows a schematic of the polarization distribution for a ray pencil downstream of the polarization-influencing optical element of FIG. 17.

FIG. 18 shows the polarization distribution inside the ray pencil 821' downstream of the polarization-influencing element illustrated in FIG. 17. The E-field vectors 823' are respectively oriented in this case parallel to the incidence plane of the rays on the axicon surfaces. Since plane segments are involved, the incidence planes for rays that strike the same segment are parallel to one another. They are parallel to a plane that is perpendicular to the segment and includes the direction of the maximum surface gradient of this segment.

In order again to obtain rays polarized in the y-direction downstream of the axicon module with pyramidal axicon elements, the raster arrangement 725' illustrated in FIG. 17 can again be arranged downstream of the axicon module as polarization-influencing optical element.

Figure 19:
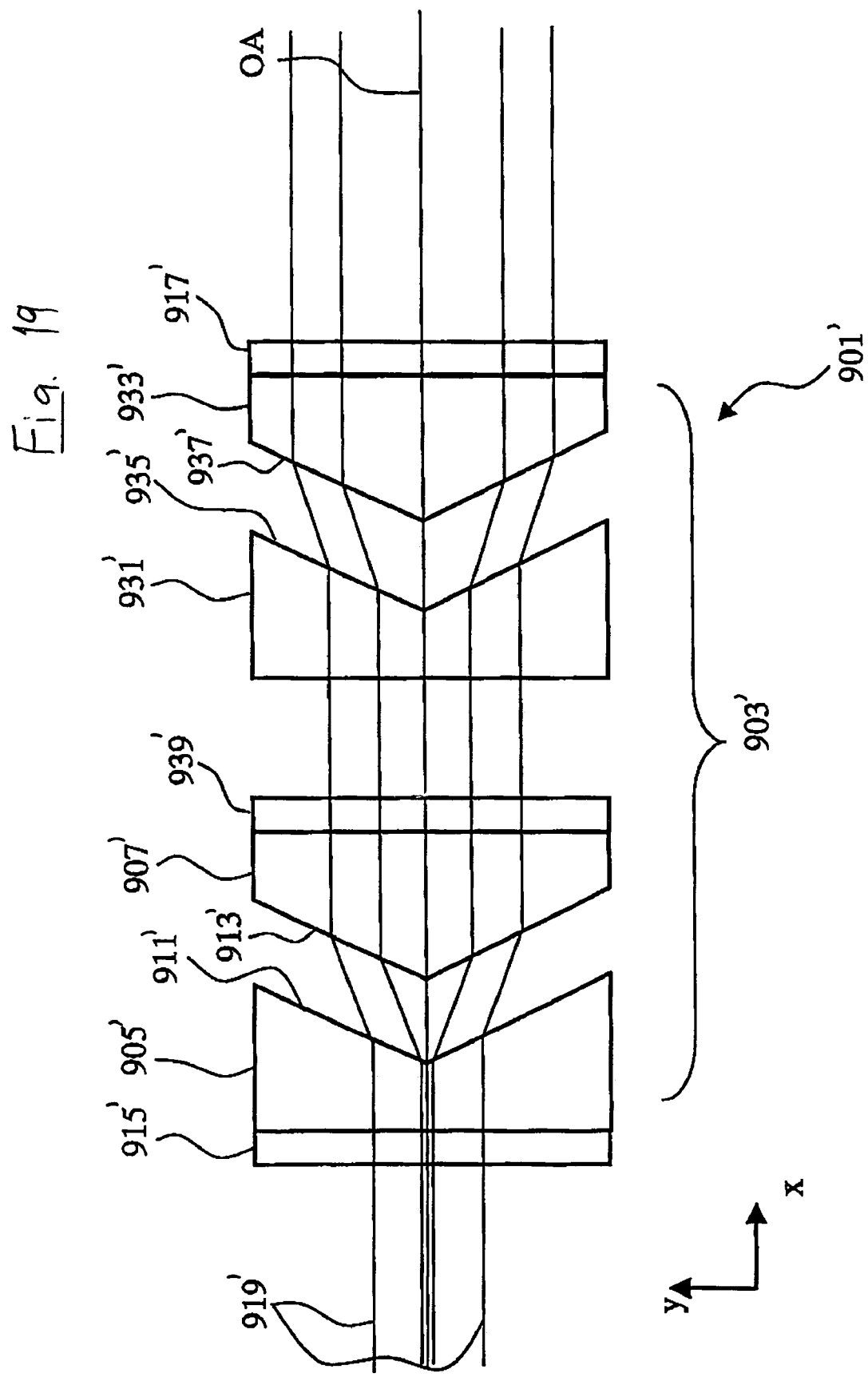
FIG. 19 shows a third exemplary embodiment of an illuminating system comprising an axicon module.
Figure 20:
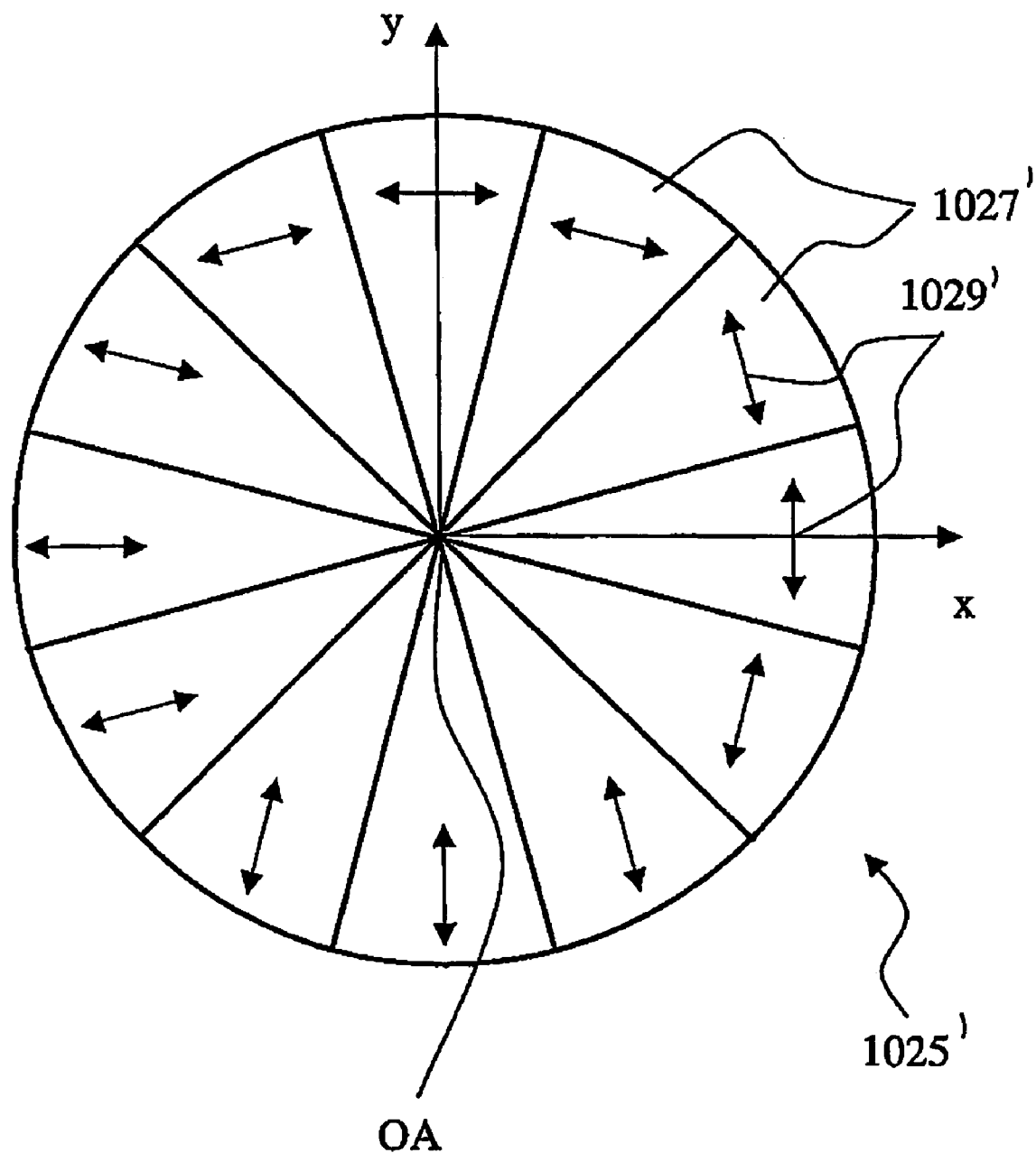
FIG. 20 shows a schematic of a third exemplary embodiment of a polarization-influencing optical element.

FIG. 19 shows a third exemplary embodiment of an illuminating system 901'. The axicon module 903 is illustrated together with the polarization-influencing optical elements 915', 939' and 917'. The elements in FIG. 19 corresponding to the elements of FIG. 11 have the same reference numerals as in FIG. 11, but increased by the number 900'. Reference is made to the description of FIG. 11 for a description of these elements. The axicon module 903' consists in this case of the axicon elements 905' and 907' with the conical axicon surfaces 911' and 913', as well as the axicon elements 931' and 933' with the pyramidal axicon surfaces 935' and 937'. As is described together with a similar design in FIG. 8 of EP 0 949 541, this axicon module 903' can be used to optionally produce a variable annular illumination and/or a variable multipole illumination. In this case, as well, before they strike the polarization-influencing optical element 915' the rays 919' are to be polarized linearly in the y-direction, as illustrated in FIG. 13. The polarization-influencing optical element 915' consists of a raster arrangement of half-wave plates as illustrated in FIG. 14. Consequently, as illustrated in FIG. 15, the rays 919' are radially polarized and pass with minimal reflection losses through the conical axicon elements 905' and 907'. FIG. 20 illustrates an exemplary embodiment of the polarization-influencing optical element 939'. The polarization influencing element 939' consists here of a raster arrangement 1025' of individual half-wave plates 1027'. The principal axes 1029' of the individual half-wave plates 1027' are oriented in this case such that they point in the direction of the angular bisector between the radially oriented E-field vectors of the rays 919' and the distribution of the E-field vectors prescribed by the pyramidal shape of the axicon surfaces 935' and 937'. The distribution of the E-field vectors downstream of the polarization-influencing optical element 939' is illustrated by way of example in FIG. 18. The rays 919' are therefore linearly polarized, in each case parallel to the incidence plane, when they strike the pyramidal axicon surfaces 935' and 937'. Finally, the polarization-influencing optical element 917' reproduces a linear polarization distribution oriented in the y-direction. In this case, the polarization-influencing optical element 917' consists, for example, of a raster arrangement of 4 half-wave plates as illustrated in FIG. 17. It is therefore possible to maintain the polarization state of rays without losses in intensity even given a juxtaposition of conical and pyramidal axicon elements.

If the rays 19' or 619' or 919' are circularly polarized, the polarization-influencing optical element 15' or 615' or 915' has a quarter-wave plate that is arranged in the light direction upstream of the raster arrangement of half-wave plates. The principal axis of the quarter-wave plates is at 45° to the y-direction here. Consequently, rays linearly polarized in the y-direction and whose polarization state is suitably influenced by the raster arrangements of half-wave plates are produced from the circularly polarized rays.

If circularly polarized light is desired following the axicon module 3' or 603' or 903', the polarization-influencing optical element 17' or 617' or 917' has a quarter-wave plate that is arranged in the light direction downstream of the raster arrangement of half-wave plates. The principal axis of the quarter-wave plate is at 45° in the y-direction here. Consequently, circularly polarized rays are produced from the rays linearly polarized in the y-direction.

Figure 21:
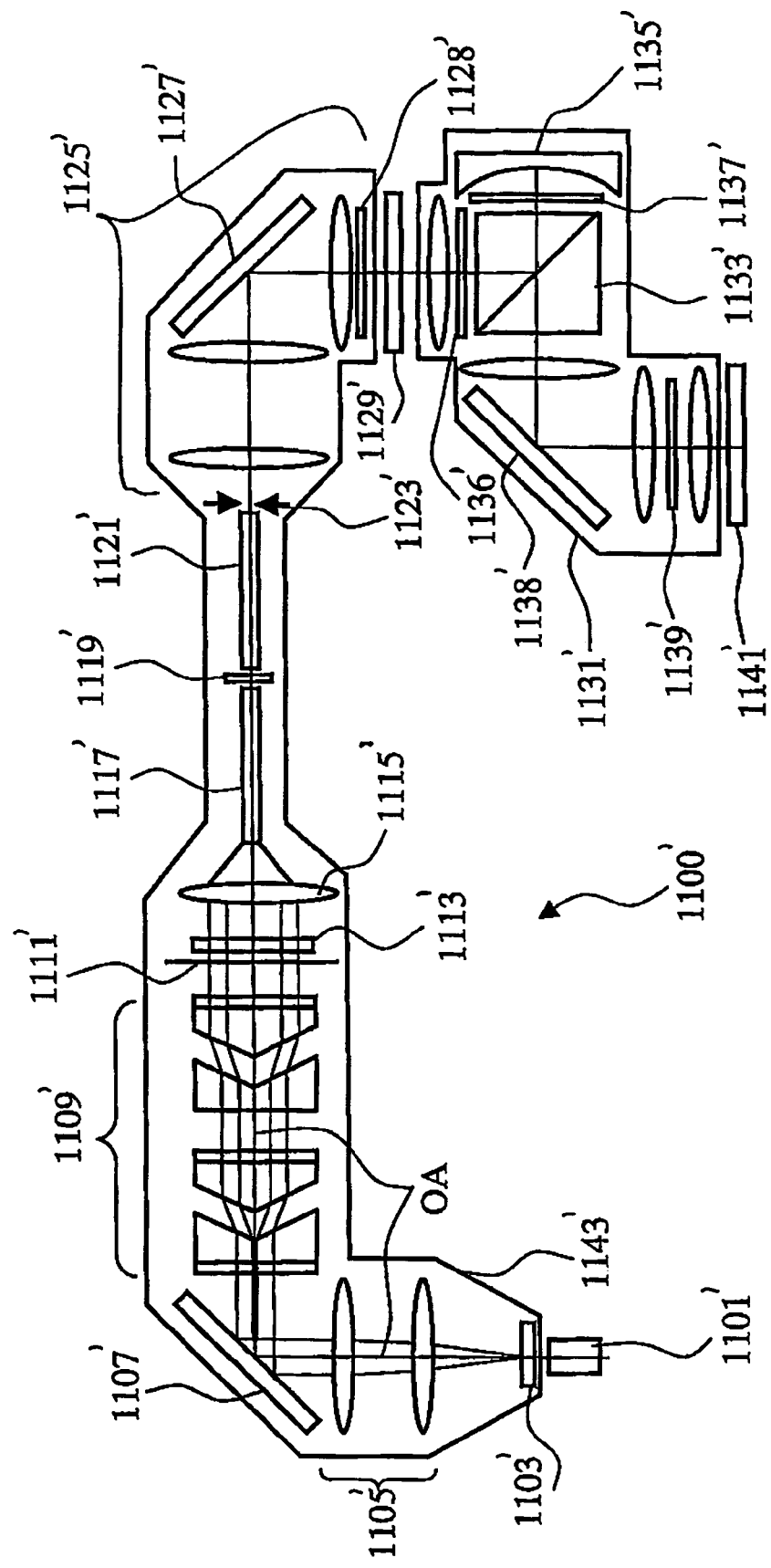
FIG. 21 shows a schematic of a microlithography projection exposure apparatus.

FIG. 21 shows a schematic of a microlithography projection exposure apparatus 1100' comprising the light source unit 1101', the illuminating system 1143', the pattern-bearing mask 1129, the projection objective 1131' and the substrate 1141' to be exposed. As light source, the light source unit 1101' comprises a DUV or VUV laser, for example an ArF laser for 193 nm, an $F_2$ laser for 157 nm, an $Ar_2$ laser for 126 nm or an $Ne_2$ laser for 109 nm, and a beam-shaping optics that produces a parallel light pencil. The rays of the light pencil are linearly polarized parallel to the y-direction, which is perpendicular to the optical axis OA. The illuminating system 1143' comprises the components 1103' to 1128'. DE 195 20 563 (U.S. Pat. No. 6,258,443) describes the design principle of the illuminating system 1143'. The parallel light pencil strikes the divergence-increasing optical element 1103'. A raster plate of diffractive or refractive raster elements, for example, can be used as divergence-increasing optical element 1103'. Each raster element produces a ray pencil whose angular distribution is determined by the extent and focal length of the raster element. The raster plate is located in the object plane of a downstream objective 1105', or in the vicinity thereof. The objective 1105' is a zoom objective that produces a parallel light pencil of variable diameter. The parallel light pencil is directed onto an optical unit 1109' by the deflecting mirror 1107' that is tilted about the x-axis. The direction of the x-axis is maintained owing to the deflecting mirror, while the y-axis continues to be perpendicular to the optical axis OA. The optical unit 1109' consists of an axicon module and suitably adapted polarization-influencing elements. The optical unit 1109' is known from FIG. 19. Reference may be made to the description of FIG. 19 for closer explanation. A conventional illumination of small or large illumination diameter is produced by the zoom objective 1105' and the optical unit 1109' in the stop plane 1111', optionally with the axicon elements moved up depending on the state of the zoom objective 1105'. The outer shape of the illumination depends on the shape of the raster elements of the divergence-increasing optical element 1103'. By moving apart the axicon elements of the optical unit 1109', it is possible to produce an annular or a multipole illumination depending on which axicon elements are moved. The light in the stop plane 1111' is linearly polarized in the y-direction by the appropriately adapted polarization-influencing elements in the optical unit 1109'. Alternatively, the optical unit known from FIG. 11 or FIG. 16 can also be used. Following downstream of the stop plane 1111' is a further divergence-increasing optical element 1113', which is, for example, a raster plate of diffractive or refractive raster elements. The angular distribution produced by the raster elements is adapted here to the entrance surface of a downstream glass rod 1117'. The angular distribution produced by the divergence-increasing optical element 1113' is transformed by the incoupling optics 1115' into a field distribution at the entrance surface of the glass rod 1117'. Following downstream of the glass rod 1117' is an optical delay system 1119' that transposes two mutually orthogonal polarization states. Following the optical delay system 1119' is a further glass rod 1121', which has the same dimensions as the glass rod 1117'. As a result of the arrangement of the optical delay system between the two glass rods, the light rays are guided through the two glass rods in a polarization-maintaining fashion. Such an optical system is described in more detail in DE 103 11 809 (PCT/EP02/12446), whose content is adopted in full in this application. Following the glass rod 1121' is a reticle masking system (REMA) 1123' that is imaged onto the pattern-bearing mask (reticle) 1129' by an REMA objective 1125', and thereby limits the illuminated region on the reticle 1129'. The REMA objective 1125' comprises a deflecting mirror 1127' that is tilted about the x-axis. The direction of the x-axis is maintained by the deflecting mirror, while the y-axis continues to be perpendicular to the optical axis OA. The quarter-wave plate 1128' arranged upstream of the reticle 1129' generates a circular polarization distribution. The reticle 1129' is imaged onto the wafer 1141' with the aid of the catadioptric objective 1131'. The catadioptric objective 1131' comprises a polarization-optical beam splitter 1133', a quarter-wave plate 1136', a quarter-wave plate 1137', a concave mirror 1135', a deflecting mirror 1138', a polarization-influencing optical element 1138' for producing tangential polarization, and further optical elements. Catadioptric projection objectives with a polarization-optical beam splitter are disclosed, for example, in EP 1 227 354 (US 2002/167737) or U.S. Pat. No. 6,522,483. The polarization-optical beam splitter layer of the beam splitter 1133', and the deflecting mirror 1138' are respectively tilted about the x-axis. The orientation of the x-axis is thereby maintained, while the y-axis is respectively perpendicular to the optical axis OA. Exemplary embodiments for the polarization-influencing optical element 1139' are given in DE 100 10 131 (U.S. Ser. No. 09/797,961). Both the reticle 1129' and the wafer 1141' have a suitable holding device that permits an exchange of the elements and also the scanning movement of the elements.

It is clear from the description of the microlithography projection exposure apparatus illustrated in FIG. 21 that said apparatus has a multiplicity of polarization-influencing elements. These include, for example, the deflecting mirrors 1107', 1127' and 1138'. A reflection at the deflecting mirrors 1107', 1127' and 1138' that is as free from loss as possible requires the rays to be linearly polarized parallel to the incidence plane, that is to say in the y-direction in each case. On the other hand, in the optical unit 1109' the illuminating system has axicon elements for which it is expedient when the polarization distribution is oriented tangential or radial to the optical axis. The glass rods 1117' and 1121' can also vary the polarization state of the rays on the basis of birefringent properties of the glass materials. In order for the rays not to be diffracted as a function of pattern at the reticle, it is favorable when the rays are circularly polarized at the reticle. The polarization distribution of the rays likewise has to be suitably adapted at the polarization-optical beam splitter 1133'. Thus, the rays must be s-polarized in order to be reflected, and p-polarized in order to be transmitted. Finally, it is expedient for the lithographic imaging when the rays are tangentially polarized before they come to interfere in the image plane of the projection objective.

The microlithography projection exposure apparatus 1100' now has additional polarization-influencing optical elements in order to adapt the polarization distribution of the rays to the respective requirements. The means presented respectively influence the polarization distribution of the rays approximately without loss in this case. Thus, the linear polarization direction of the light source unit 1101' is firstly orientated in such a way that the light rays are linearly polarized parallel to the y-direction. As a result, the rays are polarized parallel to the respective incidence plane on the deflecting mirror 1107'. The polarization-influencing optical elements in the optical unit 1109' are adapted such that the rays pass the axicon elements in as lostless a fashion as possible and subsequently strike the stop plane 1111' in a way linearly polarized in the y-direction. Arranged between the two glass rods 1117' and 1121' is the optical delay system 1119', which ensures that the rays at the output of the glass rod 1121' are again linearly polarized in the y-direction. Consequently, the light rays again strike the deflecting mirror 1127' with the ideal polarization direction. Since the rays strike the reticle 1129' in a circularly polarized fashion because of the quarter-wave plate 1128', the patterns on the reticle are imaged virtually independently of orientation. The rays are s-polarized with reference to the beam splitter surface of the polarization-optical beam splitter 1133' by the quarter-wave plate 1136'. The rays are p-polarized by their double passage through the quarter-wave plate 1137' when they strike the beam splitter surface of the polarization-optical beam splitter 1133' for the second time, and are therefore transmitted. Finally, the polarization-influencing device 1139' produces a tangential polarization distribution from the linear polarization distribution in order to improve the two-beam interference.

Figure 22:
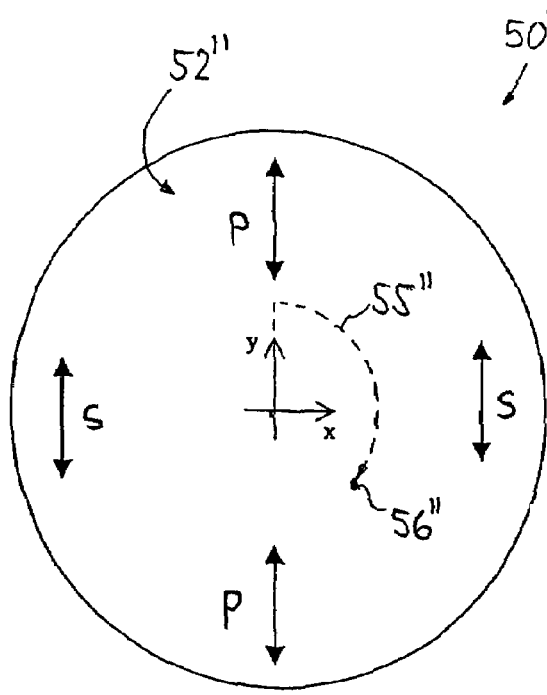
FIG. 22 shows a schematic axial plan view of a conical entrance surface on an axicon element on which linearly polarized light impinges.
Figure 23:
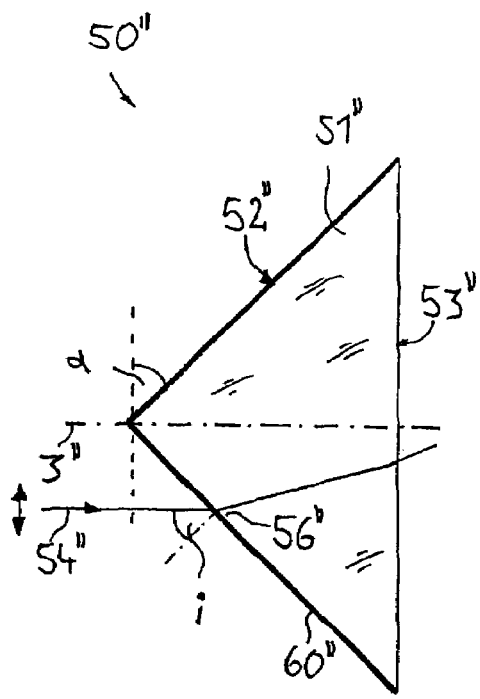
FIG. 23 shows a schematic side view of an axicon element with conical axicon surface.
Figure 24:
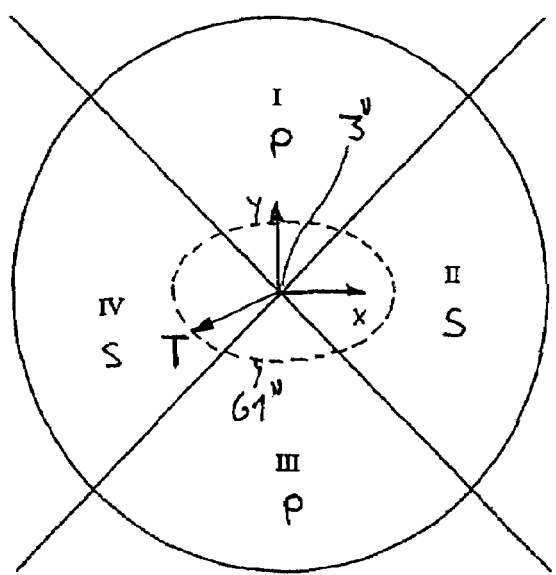
FIG. 24 shows a schematic of the division of a transradiated region into four quadrants centered about the x- and y-axes of the axicon system in order to explain the energy ellipticity.

With the aid of FIGS. 22 to 24, the production of spatial transmission inhomogeneities will firstly be described for an axicon system 50" that comprises in the case of example an individual axicon element 51" consisting of transparent material.

The axicon element centered about the optical axis 3" has a conical axicon surface 52" that in the case of the transradiation direction shown forms the entrance surface of the axicon element, and, as further surface, a flat exit surface 53" aligned perpendicular to the optical axis. The conical axicon surface 52" is at an inclination angle α to a plane running perpendicular to the optical axis, as a result of which a light beam 54" that impinges on the axicon surface in a fashion parallel to the optical axis 3" encloses with said axicon surface an incidence angle or incident angle i that is measured between the incidence direction and a surface normal to the axicon surface at the point of impingement 56". The optical axis 3" may run in the z direction, to which the x- and y-axes of the axicon system may run perpendicularly.

This axicon element may be irradiated with completely linearly polarized entrance light whose preferred polarization direction (double arrows) is aligned parallel to the y-axis. The entrance light may have a homogeneous, that is to say uniform intensity over the entire cross section of the axicon system.

It is to be noted in these circumstances that depending on azimuth angle 55" of a beam impingement location 56" the linear polarization at the axicon surface is either exclusively p-polarized or exclusively s-polarized, or has a mixed polarization state with components of p- and s-polarization of different strength. The s-component is that electric field strength component which runs perpendicular to the incidence plane that is defined by the surface normal to the axicon surface at the point of impingement and the beam entrance direction. The p-component is the electric field strength component that vibrates parallel to the incidence plane, that is to say in the incidence plane itself.

Because the alignment of the incidence planes is a function of azimuth angle, the entering light experiences, on the basis of Fresnel losses, attenuation of the p- and s-components of the electric field strength that depends on the location of incidence or impingement location and thus differs locally. Consequently, attenuation of the radiation that varies in the azimuthal direction (circumferential direction) occurs at the axicon surface, and consequently a corresponding intensity inhomogeneity occurs downstream of the axicon element. In this case, the light is completely p-polarized at all impingement locations lying on the y-axis, while it is completely s-polarized at all impingement locations lying on the x-axis. During transition between these extreme situations, there is a gradual reduction in the p-component and a gradual increase in the s-component, or vice versa, between the y- and x-axes and so the two components are present at different strengths in all regions between y- and x-directions. If it is now considered that in the case of normal Fresnel reflections the s-polarized components generally have a higher reflection factor than the p-components, and the reflection factor for s-polarization rises monotonically as a rule with rising incident angles i, while for p-polarization the reflection factor is strongly dependent on incident angle and exhibits a pronounced minimum at the so-called Brewster angle it is evident that the transmission of the axicon element will generally be higher in regions about the y-axis with a strongly predominant p-component than in regions about the x-axis, where s-polarization is predominant.

Consequently, the energy distribution of the radiation after it passes through the axicon element exhibits in the pupil thereof a two-fold radial symmetry in the case of which quadrants I and III centered about the y-axis having a relatively high intensity exist, while a lesser light intensity is to be found in the quadrants II and IV centered about the x-axis (FIG. 24). An estimate for typical inclination angles α which the incident angle can meet in the vicinity of the Brewster angle produces a difference in the light energy in the neighboring quadrant of the order of magnitude of up to 10%. This leads to an energy ellipticity of the pupil that can be up to 10%, for example. The ellipticity E is defined here as:

$$E = 100 - \frac{I(I) + I(III)}{I(II) + I(IV)} \cdot 100\%$$

However, substantially smaller ellipticity values are normally the aim, for example with E<1%. The invention provides compensation means for reducing this ellipticity.

In the case of the embodiment of an axicon in accordance with FIG. 23, the axicon surface 52" is occupied by an optical compensation coating 60" that is applied to the conical surface by means of a suitable PVD method, for example, in particular by electron beam vaporization. The compensation layer is a multi-layer pack with individual layers made from dielectric materials of different refractive indices, high-index and low-index material lying alternatively one above another in order to achieve the optical effect via interference effects. In the case of the example, the compensation layer 60" is designed such that the azimuthal regions, lying about the y-axis, of the compensation layer have a substantially lower transmittance T or higher reflection factor than those azimuthal regions that are centered about the x-axis and therefore lie in the center of the quadrants II and IV. A continuous transition takes place between these regions.

Shown schematically in FIG. 24 is the associated elliptic transmission function T of the compensation layer 60" in the case of which the distance of the line of the ellipse 61" (shown with dashed lines) from the optical axis 3" is a measure of the transmittance of the compensation coating at the respective azimuth angle. Here, the ellipticity of the transmission function of the compensation layer is substantially reciprocal relative to the ellipticity of the transmission of the axicon element that results on the basis of the azimuthally varying polarization states. It is thereby possible to achieve a far-reaching or complete compensation of the transmission inhomogeneity caused by the axicon geometry and polarization effects.

A comparable elliptic transmission function of a coating can also be achieved by designing the coating as a gray filter layer with azimuthally varying transmission.

As an alternative or in addition to the axicon surface 52", it is also possible for the further surface 53" to be occupied by a suitable compensation layer. An occupancy of the two layers can be advantageous, in particular when only an incomplete compensation is possible with a single layer. The coating of a flat or, if appropriate, slightly curved coating surface similar to the exit surface 53" can also be advantageous for reasons of production engineering.

Figure 25:
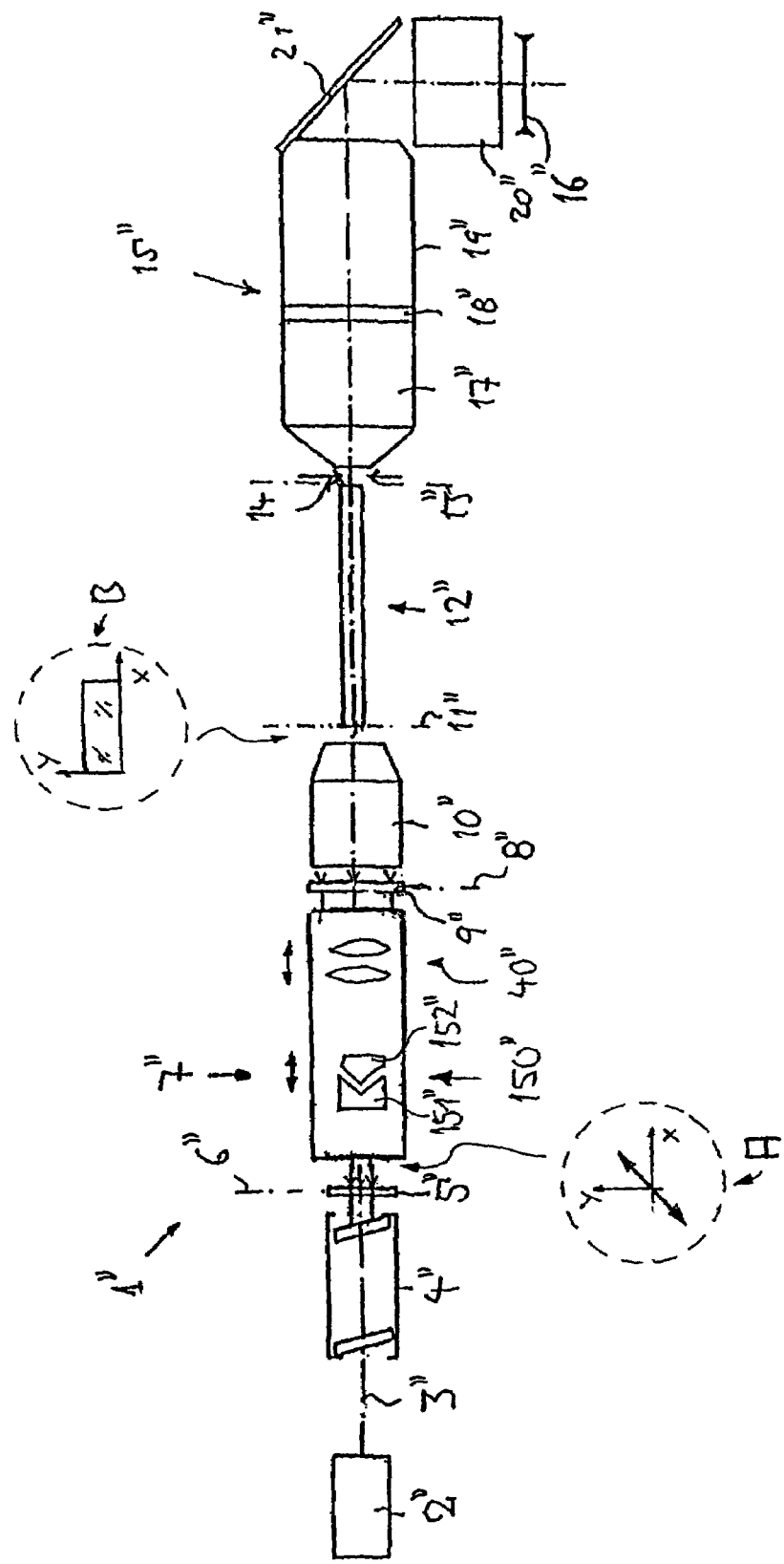
FIG. 25 shows a diagrammatic overview of an embodiment of an illuminating system for a microlithography projection exposure apparatus in which various embodiments of compensation means according to the invention are implemented.

As an example for the use of axicon elements and/or axicon systems according to the invention, FIG. 25 shows an illuminating system 1" of a micro-lithographic projection exposure apparatus which can be used in the production of semiconductor components and other finely structured subassemblies, and operates for the purpose of achieving resolutions of up to fractions of micrometers by using light from the deep ultraviolet region. Serving as light source 2" is an $F_2$ excimer laser with an operating wavelength of approximately 157 nm, whose light beam is aligned coaxially with the optical axis 3" of the illuminating system. Other UV light sources, for example ArF excimer lasers with a 193 nm operating wavelength, KrF excimer lasers with a 248 nm operating wavelength or light sources with wavelengths below 157 nm, are likewise possible.

The linearly polarized light from the light source 2" firstly enters a beam expander 4", which can be designed, for example, as a mirror arrangement in accordance with DE 41 24 311, and serves the purpose of reducing coherence and enlarging the beam cross section. An optionally provided closure is replaced in the case of the embodiment shown by an appropriate pulse controller of the laser 2".

A first diffractive, optical raster element 5" serving as beam shaping element is arranged in the object plane 6" of an objective 7" which is arranged downstream thereof in the beam path and in whose image plane 8" or exit pupil a refractive second optical raster element 9" is arranged which likewise serves as beam shaping element.

An optical coupling system 10" arranged downstream thereof transmits the light onto the entrance plane 11" of a light mixer 12" which mixes and homogenizes the penetrating light. Situated directly at the exit plane 13" of the light mixer 12" is an intermediate field plane in which a reticle/masking system (REMA) 14" is arranged which serves as an adjustable field stop. The subsequent objective 15" images the intermediate field plane with the masking system 14" onto the reticle 16" (mask, lithography original) and includes a first lens group 17", a pupil intermediate plane 18", into which filters or stops can be introduced, a second and a third lens group 19" and 20" and, therebetween, a deflecting mirror 21" which permits the large illuminating device (approximately 3 m long) to be installed horizontally and the reticle 16" to be mounted horizontally.

Together with a catadioptric projection objective (not shown) with a polarization-selective beam splitter (beam splitter cube, BSC) and an adjustable wafer holder which holds the reticle 16" in the object plane of the projection objective, this illuminating system forms a projection exposure apparatus for the microlithographic production of electronic subassemblies, but also of optically diffractive elements and other microstructured parts.

The design of the parts upstream of the light mixer 12", in particular of the optical raster elements 5" and 9", is selected such that a rectangular entrance surface of the light mixer is illuminated largely homogeneously and with the highest possible efficiency, that is to say without substantial light losses apart from the entrance surface. For this purpose, the parallel light beam coming from the beam expander 4" and having a rectangular cross section and a divergence lacking rotational symmetry is firstly varied by the first diffractive raster element 5" with the introduction of photoconductance with reference to divergence and shape. The linear polarization of the laser light remains largely constant in this case.

The first optical raster element 5", arranged in the front focal plane (object plane) of the objective 7", prepares together with the objective 7" an illuminating spot of variable size and light distribution in the exit pupil or image plane 8" of the optical system 7". Arranged here is the second optical raster element 9', which is designed in the example as a refractive optical element with a rectangular emission characteristic. This beam shaping element produces the main component of the photoconductance and adapts the photoconductance via the optical coupling system 10" to the field coverage, that is to say to the rectangular shape of the entrance surface of the rod integrator 12".

The design of the previously described illuminating system with the exception of the objective 7" can correspond, for example, to the design described in EP 0 747 772, whose disclosure content is to this extent incorporated in the content of this description by reference.

The objective 7", which is also designated below as a zoom/axicon system, includes a transmission-compensated axicon system 150" which can be set variably and serves the purpose of transforming an entrance light distribution striking its entrance surface into an exit light distribution emerging from an exit surface by radial redistribution of light intensity, and also includes a zoom system 40", likewise settable, for variably setting the diameter of a light distribution output by the zoom system. Consequently, an essentially round illuminating spot of largely uniform intensity and with a settable diameter or a desired light distribution having an intensity which is increased outside the optical axis relative to the axial region can optionally be produced at the entrance surface of the raster element 9", for example in the form of a ring with a variable inside and outside diameter.

The axicon system 150" is largely energetically compensated and comprises a first axicon element 151" and a second axicon element 152" that is arranged downstream thereof in the light propagation direction and whose axial distance can be continuously adjusted by means of an adjusting device (not shown) and, if appropriate, reduced down to a distance of zero. The first axicon element 151" has a flat or slightly spherical entrance surface and a concave conical exit surface, while the second axicon element 152" is fashioned with a convex conical entrance surface and flat or slightly spherical exit surface and is therefore designed to be similar to the exemplary embodiment of FIGS. 22 and 23. On its entrance surface and/or its exit surface, each of the axicon elements has a compensation coating that partially or completely compensates the transmission inhomogeneities caused by geometry and polarization, such that the intensity distribution is largely homogeneous inside illuminated regions downstream of the objective 7".

In another embodiment, in order to avoid energy inhomogeneities the compensation means are formed by virtue of the fact that the preferred polarization direction of the linearly polarized laser light is aligned at an angle of approximately 45° to the x- or y-axis (partial Figure A). In conjunction with an energy ellipticity, that is produced by the rod integrator 12" of rectangular cross section (partial Figure B), this leads again, downstream of the rod integrator, to a largely energetically compensated light distribution, since the ellipticity, introduced by the (not compensated) axicon elements, of the energy distribution is largely or completely compensated by a reciprocally aligned ellipticity of the transmission of the rod integrator 12". This is because the rod integrator mixes the quadrants I to IV by total internal reflection in such a way that the energetically elliptical pupil can be compensated. It has emerged that the efficiency of this compensation is a function of the illumination setting, and for high degrees of coherence (corresponding to many total reflections in the rod integrator) generally functions better than at lower settings where fewer reflections take place in the integrator rod. A combination of the compensation means described here can likewise be provided.

The invention can also be used similarly in the case of reflectively operating axicon systems, for example in illuminating systems for EUV lithography that operate with extremely short UV wavelengths in the region of soft x-radiation. The term "light" is intended also to cover such short-wave radiation. In the case of such systems, their "transmission" efficiency for the dissemination of incident radiation is determined by the reflection factor of the mirror surfaces. The term "transmittance" is thus generally to be understood in the case of reflective systems as "dissemination efficiency" for the incident and then reflected radiation.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. An optical beam transformation system comprising:
   a sequence of optical elements arranged along an optical axis of the optical beam transformation system and designed for transforming an entrance light distribution striking an entrance surface of the optical beam transformation system into an exit light distribution emerging from an exit surface of the optical beam transformation system by radial redistribution of light intensity; the optical elements comprising:

a first transformation element with a first transformation surface inclined to the optical axis, and a second transformation element, arranged downstream of the first transformation element, with a second transformation surface inclined to the optical axis, each of the transformation surfaces causing a radial redistribution of light intensity and a polarization-selective reflection of a light distribution incident on the transformation surface according to an efficiency symmetry characteristic for the transformation surface; and an optical compensation element effecting a spatially dependent compensation of transmission inhomogeneities caused by the polarization-selective reflection of the first transformation surface according to a compensation symmetry adapted to the efficiency symmetry of the first transformation surface, arranged in the light direction upstream of the first transformation surface, and designed such that rays striking the transformation surfaces are polarized approximately perpendicular or approximately parallel to the respective incidence plane of rays on the first transformation surface, wherein the optical compensation element comprises a first raster arrangement of half-wave plates whose principal axes are oriented such that rays striking the transformation surfaces are polarized approximately perpendicular or approximately parallel to the respective incidence plane of the rays.

2. The optical beam transformation system according to claim 1, wherein at least one of the transformation surfaces is conical.

3. The optical beam transformation system according to claim 1, wherein at least one of the transformation surfaces has the form of a multifaceted pyramid face having at least two pyramid facets inclined to the optical axis, the pyramid face having an n-fold radial symmetry about the optical axis, n being the number of the pyramid facets.

4. The optical beam transformation system according to claim 3, wherein more than four pyramid facets are provided.

5. The optical beam transformation system according to claim 1, wherein an axial spacing between the first transformation element and the second transformation element is adjustable.

6. The optical beam transformation system according to claim 1, wherein the optical compensation element has a compensation efficiency adapted to the efficiency symmetry of the transformation optical elements such that the optical beam transformation system operates in a substantially polarization-maintaining fashion, whereby each ray downstream of the optical beam transformation system has approximately the same polarization state as the same ray had upstream of the optical beam transformation system.

7. The optical beam transformation system according to claim 1, wherein the two transformation surfaces are conical in order to produce an annular illumination distribution.

8. The optical beam transformation system according to claim 1, wherein each of the two transformation surfaces comprises a number of pyramidally arranged segments for producing a multipole illumination.

9. The optical beam transformation system according to claim 8, wherein rays that strike a segment are linearly polarized parallel to a plane that is perpendicular to this segment and that contains the direction of the maximum surface gradient of this segment.

10. The optical beam transformation system according to claim 8, wherein rays that strike a segment are linearly polarized perpendicular to a plane that is perpendicular to this segment and that contains the direction of the maximum surface gradient of this segment.

11. The optical beam transformation system according to claim 1, wherein a second optical compensation element effective as a polarization-influencing optical element is arranged in the light direction downstream of the second transformation element and is designed in such a way that the rays in the light direction downstream of the second optical compensation element exhibit a prescribed polarization distribution.

12. The optical beam transformation system according to claim 11, wherein the second optical compensation element comprises a second raster arrangement of half-wave plates whose principal axes are oriented in such a way that the prescribed polarization distribution is produced.

13. The optical beam transformation system according to claim 1, wherein the optical beam transformation system is adapted to the polarization state of the radiation upstream of the optical beam transformation system such that the rays are one of linearly polarized parallel to a direction perpendicular to an optical axis and circularly polarized in the light direction downstream of the optical beam transformation system.

14. The optical beam transformation system according to claim 1, wherein the optical beam transformation system is adapted to the polarization state of the radiation upstream of the optical beam transformation system such that for each ray the polarization state in the light direction downstream of the optical beam transformation system is approximately the same as in the light direction upstream of the optical beam transformation system.

15. The optical beam transformation system according to claim 1, wherein the optical compensation element has a compensation efficiency adapted to the efficiency symmetry of the optical transformation elements such that the optical beam transformation system operates in a substantially polarization-maintaining fashion, whereby each ray downstream of the optical beam transformation system has approximately the same polarization state as the same ray had upstream of the optical beam transformation system.

16. The optical beam transformation system according to claim 1, wherein the compensation element has an anisotropic transmission according to a non-uniform spatial distribution of transmittance adapted to substantially reduce spatial transmission non-uniformities effected by the transformation element.

17. The optical beam transformation system according to claim 16, wherein the compensation element is arranged azimuthally in such a way relative to the transformation element that a light beam that passes through a region of relatively low transmission at the transformation element passes through a region of relatively high transmission in the region of the compensation element, and vice versa.

18. The optical beam transformation system according to claim 16, wherein the compensation element acts on the incident radiation with a substantially elliptic efficiency characteristic with reference to the optical axis.

19. The optical beam transformation system according to claim 16, wherein the optical compensation element has an n-fold radial compensation symmetry adapted to an n-fold efficiency symmetry of the transformation optical element, where n is an integer number with $n \geq 2$.

20. The optical beam transformation system according to claim 1, wherein the compensation element is effective for spatially dependent compensation of transmission inhomogeneities of an transformation element caused by polarization-selective reflection at the transformation surface, the compensation element acting on the incident radiation having with reference to the optical axis an essentially two-fold radially symmetrical efficiency characteristic in the case of which a first efficiency in the region around a first direction (x) running perpendicular to the optical axis is significantly higher or lower than a second efficiency in the region of a second direction (y) running perpendicular to the first direction and to the optical axis.

21. The optical beam transformation system according to claim 1, wherein at least one optical surface of the optical beam transformation system is occupied by an optical compensation coating effective as a compensation element for the spatially dependent compensation of the transmission inhomogeneities caused by polarization-selective reflection at the transformation surface.

22. The optical beam transformation system according to claim 21, wherein the compensation coating is designed such that with reference to transmission losses it essentially produces in a spatially resolving fashion an effect that is reciprocal to that of an uncoated transformation surface.

23. The optical beam transformation system according to claim 21, wherein at least one compensation coating is a multilayer interference layer system having alternating high-index and low-index dielectric individual layers with an azimuthally varying transmission efficiency.

24. The optical beam transformation system according to claim 21, wherein at least one compensation coating is a gray filter layer with an azimuthally varying transmission efficiency.

25. An optical beam transformation system comprising:
a first transformation element with a first transformation surface inclined to the optical axis, and a second transformation element, arranged downstream of the first transformation element, with a second transformation surface inclined to the optical axis; and
an optical compensation element effective as a polarization-influencing optical element arranged in the light direction upstream of the first transformation surface,
wherein the optical compensation element rotates a polarization state of rays such that rays striking the first transformation surface are polarized approximately perpendicular or approximately parallel to the respective incidence plane of the rays on the first transformation surface, and
wherein the optical compensation element comprises a first raster arrangement comprising a plurality of individual optical retardation elements.

26. The optical beam transformation system according to claim 25, wherein each of the transformation surfaces causes a radial redistribution of light intensity and a polarization-selective reflection of a light distribution incident on the transformation surface according to an efficiency symmetry characteristic for the transformation surface.

27. The optical beam transformation system according to claim 25 wherein the first raster arrangement has at least four individual optical retardation elements rotating a polarization state of rays.

28. The optical beam transformation system according to claim 25 wherein the first raster arrangement has between 10 and 100 individual optical retardation elements rotating a polarization state of rays.

29. The optical beam transformation system according to claim 25, wherein the optical compensation element is arranged immediately upstream of an optical element having the first transformation surface.

30. The optical beam transformation system according to claim 25, wherein at least one transformation element is an axicon element and the transformation surface is an axicon surface.

31. The optical beam transformation system according to claim 30, wherein the axicon surface is a conical surface.

32. The optical beam transformation system according to claim 30, wherein the axicon surface is formed as a multifaceted pyramid having at least two pyramid facets inclined to the optical axis.

33. The optical beam transformation system according to claim 32, wherein a number of individual optical retardation elements is equal to the number of pyramid facets.

34. The optical beam transformation system according to claim 25, wherein an axial spacing between the first transformation element and the second transformation element is adjustable.

35. An optical beam transformation system comprising:
a first axicon element with a first axicon surface inclined to the optical axis, and a second axicon element, arranged downstream of the first axicon element, with a second axicon surface inclined to the optical axis; and
an optical compensation element effective as a polarization-influencing optical element arranged in the light direction upstream of the first axicon surface;
wherein the optical compensation element rotates a polarization state of rays such that rays striking the first axicon surface are polarized approximately perpendicular or approximately parallel to the respective incidence plane of the rays on the first axicon surface and
wherein the optical compensation element comprises a first raster arrangement comprising a plurality of individual optical retardation elements.

36. The optical beam transformation system according to claim 35, wherein the first axicon surface is a conical surface.

37. The optical beam transformation system according to claim 35, wherein the first axicon surface is formed as a multifaceted pyramid having at least two pyramid facets inclined to the optical axis.

38. The optical beam transformation system according to claim 35, wherein an axial spacing between the first axicon element and the second axicon element is adjustable.

39. The optical beam transformation system according to claim 35, wherein the optical compensation element is arranged immediately upstream of the first axicon element having the first axicon surface.

40. An optical beam transformation system comprising:
a first axicon element with a first axicon surface inclined to the optical axis, and a second axicon element, arranged downstream of the first axicon element, with a second axicon surface inclined to the optical axis; and
an optical compensation element effective as a polarization-influencing optical element arranged in the light direction upstream of the first axicon surface;
wherein the optical compensation element comprises a first raster arrangement comprising a plurality of individual optical retardation elements ,and
wherein the individual optical retardation elements are half-wave plates whose principal axes are oriented such that rays striking the first axicon surface are polarized approximately perpendicular or approximately parallel to the respective incidence plane of the rays on the first axicon surface.

41. The optical beam transformation system according to claim 40, wherein the first axicon surface is a conical surface.

42. The optical beam transformation system according to claim 40, wherein the first axicon surface is formed as a multifaceted pyramid having at least two pyramid facets inclined to the optical axis.

43. The optical beam transformation system according to claim 40, wherein an axial spacing between the first axicon element and the second axicon element is adjustable.

44. The optical beam transformation system according to claim 40, wherein the raster arrangement has at least four of individual optical retardation elements rotating a polarization state of rays.

45. The optical beam transformation system according to claim 40, wherein the raster arrangement has between 10 and 100 individual optical retardation elements rotating a polarization state of rays.

46. An optical beam transformation system comprising:
a sequence of optical elements arranged along an optical axis of the optical beam transformation system and designed for transforming an entrance light distribution striking an entrance surface of the optical beam transformation system into an exit light distribution emerging from an exit surface of the optical beam transformation system by radial redistribution of light intensity; the optical elements comprising:
a first transformation element with a first transformation surface inclined to the optical axis, and a second transformation element, arranged downstream of the first transformation element, with a second transformation surface inclined to the optical axis,
wherein a polarization rotator for rotating the polarization of the penetrating light by approximately 90° is arranged between the first and the second transformation element.

47. The optical beam transformation system according to claim 46, wherein the polarization rotator comprises an optical delay system which effects a delay of half a wavelength or an odd multiple of half a wavelength between two mutually perpendicular states of polarization.

48. The optical beam transformation system according to claim 46, wherein at least one of the transformation surfaces is conical.

49. The optical beam transformation system according to claim 46, wherein at least one of the transformation surfaces has the form of a multifaceted pyramid face having at least two pyramid facets inclined to the optical axis, the pyramid face having an n-fold radial symmetry about the optical axis, n being the number of the pyramid facets.

50. The optical beam transformation system according to claim 46, wherein an axial spacing between the first transformation element and the second transformation element is adjustable.

51. The optical beam transformation system according to claim 46, wherein the two transformation surfaces are conical in order to produce an annular illumination distribution.

52. An optical beam transformation system comprising:
a first axicon element with a first conical axicon surface inclined to the optical axis, and a second axicon element, arranged downstream of the first axicon element, with a second conical axicon surface inclined to the optical axis; and
an optical compensation element effective as a polarization-influencing optical element arranged in the light direction upstream of the first axicon surface;
wherein the optical compensation element comprises a first raster arrangement of half-wave plates whose principal axes are oriented such that rays striking the first axicon surface are polarized approximately perpendicular or approximately parallel to the respective incidence plane of the rays on the first axicon surface.

53. The optical beam transformation system according to claim 52, wherein an axial spacing between the first axicon element and the second axicon element is adjustable.

54. An optical beam transformation system comprising:
a first transformation element with a first transformation surface inclined to the optical axis, and a second transformation element, arranged downstream of the first transformation element, with a second transformation surface inclined to the optical axis; and
an optical compensation element effective as a polarization-influencing optical element arranged in the light direction upstream of the first transformation surface,
wherein the optical compensation element comprises a first raster arrangement of half-wave plates whose principal axes are oriented such that rays striking the first transformation surface are polarized approximately perpendicular or approximately parallel to the respective incidence plane of the rays on the first transformation surface.

* * * * *